(12) United States Patent
Chuang

(10) Patent No.: US 12,022,648 B2
(45) Date of Patent: Jun. 25, 2024

(54) SEMICONDUCTOR STRUCTURE HAVING AIR GAP

(71) Applicant: NANYA TECHNOLOGY CORPORATION, New Taipei (TW)

(72) Inventor: Ching-Kai Chuang, Taipei (TW)

(73) Assignee: NANYA TECHNOLOGY CORPORATION, New Taipei (TW)

(*) Notice: Subject to any disclaimer, the term of this patent is extended or adjusted under 35 U.S.C. 154(b) by 159 days.

(21) Appl. No.: 17/582,179

(22) Filed: Jan. 24, 2022

(65) Prior Publication Data

US 2023/0238276 A1 Jul. 27, 2023

(51) Int. Cl.
| H01L 23/52 | (2006.01) |
| H01L 21/67 | (2006.01) |
| H01L 21/768 | (2006.01) |
| H10B 12/00 | (2023.01) |

(52) U.S. Cl.
CPC ..... *H10B 12/482* (2023.02); *H01L 21/67126* (2013.01); *H01L 21/7682* (2013.01); *H10B 12/485* (2023.02)

(58) Field of Classification Search
CPC ........... H01L 21/7682; H01L 21/67126; H01L 2221/1063; H01L 21/76831; H01L 21/76897; H01L 23/5222; H10B 12/482; H10B 12/485; H10B 12/0335; H10B 12/053; H10B 12/315

See application file for complete search history.

(56) References Cited

U.S. PATENT DOCUMENTS

| 5,831,330 | A | 11/1998 | Chang | |
| 9,184,091 | B2* | 11/2015 | Song | H01L 21/76897 |
| 11,665,883 | B2* | 5/2023 | Heo | H10B 12/0335 |
| | | | | 257/296 |
| 2011/0034003 | A1 | 2/2011 | Lung | |
| 2016/0247711 | A1* | 8/2016 | Kim | H01L 21/76816 |
| 2021/0098464 | A1* | 4/2021 | Huang | H10B 12/315 |

FOREIGN PATENT DOCUMENTS

| CN | 110718550 A | 1/2020 |
| TW | I636524 B | 9/2018 |
| TW | I708321 B | 10/2020 |
| TW | 202145348 A | 12/2021 |
| TW | 202147615 A | 12/2021 |

OTHER PUBLICATIONS

Office Action mailed on Apr. 17, 2023 related to Taiwanese Application No. 111115861.
Office Action mailed on Nov. 7, 2022 related to Taiwanese Application No. 111115866.

\* cited by examiner

*Primary Examiner* — Shouxiang Hu
(74) *Attorney, Agent, or Firm* — Xuan Zhang

(57) ABSTRACT

The present disclosure provides a semiconductor structure having an air gap surrounding a lower portion of a bit line, and a manufacturing method of the semiconductor structure. The semiconductor structure includes a substrate; a bit line structure disposed over the substrate; a first dielectric layer, surrounding the bit line structure; a second dielectric layer, surrounding a lower portion of the first dielectric layer, wherein the second dielectric layer is separated from the first dielectric layer by a first air gap; and a third dielectric layer, surrounding an upper portion of the first dielectric layer and sealing the first air gap.

10 Claims, 32 Drawing Sheets

SEMICONDUCTOR STRUCTURE HAVING AIR GAP

TECHNICAL FIELD

The present disclosure relates to a semiconductor structure. Particularly, the present disclosure relates to a semiconductor structure having an air gap.

DISCUSSION OF THE BACKGROUND

Due to a simplicity of structures of dynamic random-access memories (DRAM), compared to other types of memory such as static random-access memories (SRAM), a DRAM can provide more memory cells per chip area. The DRAM is composed of multiple DRAM cells. Each DRAM cell includes a capacitor for storing information and a transistor coupled to the capacitor to control when the capacitor is charged or discharged. During a read operation, a word line (WL) is asserted, thereby turning on the transistor. The turned-on transistor allows a sense amplifier to read a voltage across the capacitor through a bit line (BL). During a write operation, data to be written is provided to the BL when the WL is contacted.

In order to meet a demand for greater amounts of memory storage, sizes of DRAM memory cells continue to decrease; as such, a packaging density of the DRAMs has greatly increased. However, due to the size reduction of the DRAM memory cells, capacitive coupling, which leads to increases in parasitic capacitance, has become an increasingly important issue. As a result of the increased parasitic capacitance, a speed of the DRAM memory cell is undesirably reduced, and an overall device performance is negatively affected.

This Discussion of the Background section is provided for background information only. The statements in this Discussion of the Background are not an admission that the subject matter disclosed in this Discussion of the Background section constitute prior art to the present disclosure, and no part of this Discussion of the Background section may be used as an admission that any part of this application, including this Discussion of the Background section, constitutes prior art to the present disclosure.

SUMMARY

One aspect of the present disclosure provides a semiconductor structure, which includes: a substrate; a bit line structure disposed over the substrate; a first dielectric layer, surrounding the bit line structure; a second dielectric layer, surrounding a lower portion of the first dielectric layer, wherein the second dielectric layer is separated from the first dielectric layer by a first air gap; and a third dielectric layer, surrounding an upper portion of the first dielectric layer and sealing the first air gap.

In some embodiments, the semiconductor structure further includes a fourth dielectric layer, disposed between the second dielectric layer and the third dielectric layer.

In some embodiments, the fourth dielectric layer is disposed between the first air gap and the first dielectric layer.

In some embodiments, the semiconductor structure further includes a contact, disposed on the substrate and adjacent to the bit line structure.

In some embodiments, a distance between a top of the first air gap and the substrate is greater than a distance between a top of the contact and the substrate.

In some embodiments, the semiconductor structure further includes a landing pad, disposed over the contact and the bit line structure.

In some embodiments, the landing pad covers a top of the bit line structure.

In some embodiments, the semiconductor structure further includes a fifth dielectric layer, disposed in a portion of the landing pad, wherein the fifth dielectric layer penetrates into the landing pad and contacts the first dielectric layer or the third dielectric layer.

In some embodiments, the semiconductor structure further includes a fifth dielectric layer, disposed in a portion of the landing pad, wherein the fifth dielectric layer seals a hole of the landing pad and is separated from the first dielectric layer or the third dielectric layer.

In some embodiments, the semiconductor structure further includes a second air gap, surrounding the upper portion of the first dielectric layer and disposed between the first dielectric layer and the third dielectric layer.

In some embodiments, the second air gap is separated from the first air gap.

In some embodiments, the second air gap extends from a top of the first dielectric layer toward the first air gap.

In some embodiments, the first air gap is elongated perpendicular to the substrate, and the second air gap is tapered toward the first air gap.

Another aspect of the present disclosure provides a semiconductor structure. The semiconductor structure includes: a first bit line and a first spacer structure. The first bit line is disposed over a substrate. The first spacer structure surrounds the first bit line and includes a first dielectric layer and a first air gap sealed by the first dielectric layer. The first air gap surrounds a lower portion of the first bit line.

In some embodiments, a distance between a top of the first air gap and the substrate is greater than a distance between a top of a metal layer of the first bit line and the substrate.

In some embodiments, the semiconductor structure further includes a contact, surrounding the first spacer structure, wherein the distance between the top of the first air gap and the substrate is greater than or equal to a distance between a top of the contact and the substrate.

In some embodiments, the semiconductor structure further includes a landing pad, disposed over the contact and contacting a portion of the first spacer structure.

In some embodiments, a top portion of the first air gap is surrounded by the landing pad.

In some embodiments, the semiconductor structure further includes a second bit line, disposed over the substrate and adjacent to the first bit line; and a second spacer structure, surrounding the second bit line, and comprising a second dielectric layer and a second air gap sealed by the second dielectric layer.

In some embodiments, the semiconductor structure further includes a contact, disposed between the first bit line and the second bit line, wherein a distance between a top of the second air gap and the substrate is greater than a distance between a top of the contact and the substrate.

In some embodiments, the first spacer structure further includes a third air gap, disposed in the first dielectric layer and above the first air gap.

In some embodiments, the third air gap is separated from the first air gap.

In some embodiments, a dimension of the third air gap is less than a dimension of the first air gap.

In some embodiments, the first spacer structure further includes a native dielectric layer, disposed in the first dielectric layer and between the first air gap and the third air gap.

Another aspect of the present disclosure provides a method for manufacturing a semiconductor structure. The method includes: forming a bit line over a substrate; forming a first spacer layer over and conformal to the bit line; forming a sacrificial layer over and conformal to the first spacer layer; forming a second spacer layer over and conformal to the sacrificial layer; forming a mask layer covering a lower portion of the second spacer layer; removing an upper portion of the second spacer layer; removing the sacrificial layer; and forming a third spacer layer over the first spacer layer and the second spacer layer, thereby forming a first air gap surrounded by the lower portion of the second spacer layer.

In some embodiments, the first spacer layer, the first air gap, the second spacer layer and the third spacer layer together are defined as a spacer structure, and the spacer structure is tapered from the substrate.

In some embodiments, a thickness of the spacer structure above the first air gap is substantially equal to a total thickness of the first spacer layer and the third spacer layer.

In some embodiments, a thickness of the spacer structure at the lower portion of the second spacer layer is substantially equal to a total thickness of the first spacer layer, the sacrificial layer, the second spacer layer and the third spacer layer.

In some embodiments, a boundary between the lower portion of the second spacer layer and the upper portion of the second spacer layer is defined by the mask layer.

In some embodiments, a height of the first air gap is defined by the mask layer.

In some embodiments, a wet etching is performed to remove the sacrificial layer disposed between the first spacer layer and the lower portion of the second spacer layer.

In some embodiments, the method further includes forming a native dielectric layer conformally over the first spacer layer and the lower portion of the second spacer layer after the upper portion of the second spacer layer is removed.

In some embodiments, the method further includes removing a portion of the first spacer layer and a portion of the third spacer layer above the first air gap; and forming a dielectric layer over the first dielectric layer and the third dielectric layer, thereby forming a second air gap.

In some embodiments, a directional dry etch is performed to remove the portion of the first dielectric layer and the portion of the third dielectric layer.

In some embodiments, the method further includes exposing the substrate through the first spacer layer, the second spacer layer and the third spacer layer; and forming a contact, surrounding the first air gap, wherein a distance between a top of the first air gap and the substrate is greater than a distance between a top of the contact and the substrate.

The foregoing has outlined rather broadly the features and technical advantages of the present disclosure in order that the detailed description of the disclosure that follows may be better understood. Additional features and technical advantages of the disclosure are described hereinafter, and form the subject of the claims of the disclosure. It should be appreciated by those skilled in the art that the concepts and specific embodiments disclosed may be utilized as a basis for modifying or designing other structures, or processes, for carrying out the purposes of the present disclosure. It should also be realized by those skilled in the art that such equivalent constructions do not depart from the spirit or scope of the disclosure as set forth in the appended claims.

BRIEF DESCRIPTION OF THE DRAWINGS

A more complete understanding of the present disclosure may be derived by referring to the detailed description and claims. The disclosure should also be understood to be coupled to the figures' reference numbers, which refer to similar elements throughout the description.

DETAILED DESCRIPTION

Figure 1:
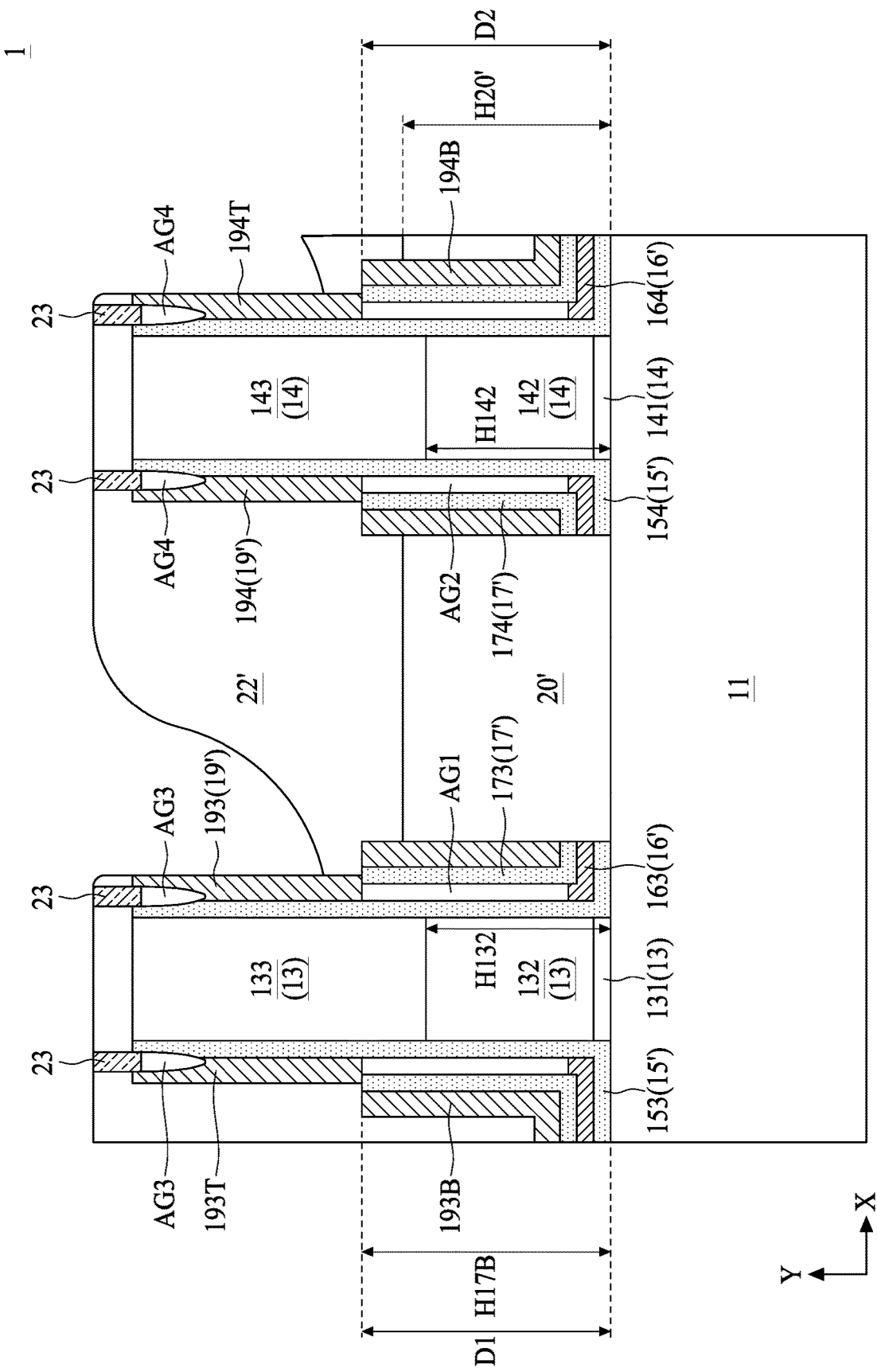
FIG. 1 is a cross-sectional view of a semiconductor structure in accordance with some embodiments of the present disclosure.

Embodiments, or examples, of the disclosure illustrated in the drawings are now described using specific language. It shall be understood that no limitation of the scope of the disclosure is hereby intended. Any alteration or modification of the described embodiments, and any further applications of principles described in this document, are to be considered as normally occurring to one of ordinary skill in the art to which the disclosure relates. Reference numerals may be repeated throughout the embodiments, but this does not necessarily mean that feature(s) of one embodiment apply to another embodiment, even if they share the same reference numeral.

It shall be understood that, although the terms first, second, third, etc. may be used herein to describe various elements, components, regions, layers or sections, these elements, components, regions, layers or sections are not limited by these terms. Rather, these terms are merely used to distinguish one element, component, region, layer or section from another element, component, region, layer or section. Thus, a first element, component, region, layer or section discussed below could be termed a second element, component, region, layer or section without departing from the teachings of the present inventive concept.

The terminology used herein is for the purpose of describing particular example embodiments only and is not intended to be limiting to the present inventive concept. As used herein, the singular forms "a," "an" and "the" are intended to include the plural forms as well, unless the context clearly indicates otherwise. It shall be understood that the terms "comprises" and "comprising," when used in this specification, point out the presence of stated features, integers, steps, operations, elements, or components, but do not preclude the presence or addition of one or more other features, integers, steps, operations, elements, components, or groups thereof.

FIG. 1 is a schematic cross-sectional view of a semiconductor structure 1 in accordance with some embodiments of the present disclosure. In some embodiments, the semiconductor structure 1 includes: a substrate 11, a first bit line 13, a second bit line 14, a first spacer layer 15', a dielectric layer 16', a second spacer layer 17', a third spacer layer 19', a contact 20', a dielectric layer 23, air gaps AG1 and AG2, and a landing pad 22'. The first bit line 13 and the second bit line 14 are disposed adjacently on the substrate 11. In some embodiments, the substrate 11 includes different components and/or one or more electrical devices. In some embodiments, the substrate 11 is a semiconductor substrate. In some embodiments, the substrate 11 includes a transistor in an active region. In some embodiments, the first bit line 13 and the second bit line 14 are disposed on the substrate 11 in the active region. In some embodiments, the first bit line 13 or the second bit line 14 is electrically connected to the transistor.

In some embodiments, the first bit line 13 includes a nitride layer 131, a metal layer 132 and a mask layer 133 stacked in sequence on the substrate 11. In some embodiments, the nitride layer 131 includes metal nitride (e.g., titanium nitride and/or tantalum nitride). In some embodiments, the metal layer 132 includes tungsten. In some embodiments, the mask layer 133 includes silicon nitride. In some embodiments, the second bit line 14 includes a nitride layer 141, a metal layer 142 and a mask layer 143 stacked in sequence on the substrate 11. In some embodiments, the second bit line 14 is similar to the first bit line 13, and description is not repeated.

In some embodiments, the first spacer layer 15', the second spacer layer 17' and the third spacer layer 19' comprehensively represent one or more spacer structures surrounding one or more bit lines over the substrate 11. In some embodiments, a first partial layer 153 of the first spacer layer 15', a first partial layer 163 of the dielectric layer 16', the air gap AG1, a first partial layer 173 of the second spacer layer 17' and a first partial layer 193 of the third spacer layer 19' together can be defined as a first spacer structure surrounding the first bit line 13. In some embodiments, a second partial layer 154 of the first spacer layer 15', a second partial layer 164 of the dielectric layer 16', the air gap AG2, a second partial layer 174 of the second spacer layer 17' and a second partial layer 194 of the third spacer layer 19' together can be defined as a second spacer structure surrounding the second bit line 14. In some embodiments, the first spacer structure further includes an air gap AG3. In some embodiments, the second spacer structure further includes an air gap AG4.

In some embodiments, the air gap AG1 surrounds a lower portion of the first bit line 13 and is disposed between the first partial layer 153 of the first spacer layer 15' and the first partial layer 173 of the second spacer layer 17'. In some embodiments, the air gap AG3 surrounds an upper portion of the first bit line 13 and is disposed between the first partial layer 153 of the first spacer layer 15' and the first partial layer 193 of the third spacer layer 19'. In some embodiments, the air gap AG3 extends toward the substrate 11 from a top of the first spacer structure. In some embodiments, the air gap AG1 is elongated perpendicular to the substrate 11, and the air gap AG3 is tapered toward the air gap AG1. In some embodiments, the air gap AG3 is separated from the air gap AG1. In some embodiments, the air gap AG1 is sealed by an upper portion 193T of the first partial layer 193 of the third spacer layer 19'.

In some embodiments, the air gap AG2 surrounds a lower portion of the second bit line 14 and is disposed between the second partial layer 154 of the first spacer layer 15' and the second partial layer 174 of the second spacer layer 17'. In some embodiments, the air gap AG4 surrounds an upper portion of the second bit line 14 and is disposed between the second partial layer 154 of the first spacer layer 15' and the second partial layer 194 of the third spacer layer 19'. In some embodiments, the air gap AG4 extends toward the substrate 11 from a top of the second spacer structure. In some embodiments, the air gap AG2 is elongated perpendicular to the substrate 11, and the air gap AG4 is tapered toward the air gap AG2. In some embodiments, the air gap AG4 is separated from the air gap AG2. In some embodiments, the air gap AG2 is sealed by an upper portion 194T of the second partial layer 194 of the third spacer layer 19'.

In some embodiments, a thickness of the first spacer structure above the air gap AG1 is substantially equal to a total thickness of the first spacer layer 15' and the third spacer layer 19'. In some embodiments, a thickness of the first spacer structure at the air gap AG1 is substantially equal to a total thickness of the first spacer layer 15', the dielectric layer 16', the second spacer layer 17' and the third spacer layer 19'. The air gap AG1 and the first partial layer 173 of the second spacer layer 17' surround only the lower portion 13B of the first bit line 13, and thus the first spacer structure is tapered from the substrate 11 toward a top of the first bit line 13. Similarly, in some embodiments, a thickness of the second spacer structure above the air gap AG2 is substantially equal to a total thickness of the first spacer layer 15' and the third spacer layer 19'. In some embodiments, a thickness of the second spacer structure at the air gap AG2 is substantially equal to a total thickness of the first spacer layer 15', the dielectric layer 16', the second spacer layer 17' and the third spacer layer 19'. The air gap AG2 and the second partial layer 174 of the second spacer layer 17' surround only the lower portion 14B of the second bit line 14, and thus the second spacer structure is tapered from the substrate 11 toward a top of the second bit line 14.

In some embodiments, a height H20' of the contact 20' from the substrate 11 to a top of the contact 20' is less than a distance D1 between a top of the air gap AG1 and the substrate 11. In some embodiments, the height H20' of the contact 20' is less than a distance D2 between a top of the air gap AG2 and the substrate 11. In some embodiments, the distance D1 is greater than a height H132 of the metal layer 132 of the first bit line 13 from the substrate 11 to a top of the metal layer 132. In some embodiments, the distance D2 is greater than a height H142 of the metal layer 142 of the second bit line 14 from the substrate 11 to a top of the metal layer 142. In some embodiments, the distance D1 is substantially equal to the distance D2 since the distance D1 and the distance D2 are both defined by a height H17B of the second spacer layer 17' measured from a top of the second spacer layer 17B to the substrate 11.

In some embodiments, the dielectric layer 23 seals the air gap AG3 and the air gap AG4. In some embodiments, the dielectric layer 23 is in physical contact with the first spacer structure and/or the second spacer structure. More specifically, in such embodiments, the dielectric layer 23 is in physical contact with the first spacer layer 15' and/or the third spacer layer 19'. Therefore, in such embodiments, a top of the air gap AG3 is lower than the top of the first bit line 13, and/or a top of the air gap AG4 is lower than the top of the second bit line 14. In some embodiments, the dielectric layer 23 is separated from the first spacer structure and/or the second spacer structure. More specifically, in such embodiments, the dielectric layer 23 is separated from the first spacer layer 15' and the third spacer layer 19' surrounding the first bit line 13 and/or surrounding the second bit line 14. Therefore, in such embodiments, the top of the air gap AG3 is higher than the top of the first bit line 13, and/or the top of the air gap AG4 is higher than the top of the second bit line 14.

In some embodiments, the first spacer layer 15', the second spacer layer 17' and the third spacer layer 19' are all nitride. In some embodiments, the first spacer layer 15', the second spacer layer 17' and the third spacer layer 19' are formed by different depositions. In some embodiments, there is no observable interface between any two of the first spacer layer 15', the second spacer layer 17' and the third spacer layer 19'. In some embodiments, the first spacer layer 15', the second spacer layer 17' and the third spacer layer 19' can be defined as one dielectric layer. In some embodiments, the dielectric layer 23 includes nitride. In some embodiments, there is no observable interface between any two of the dielectric layer 23, the first spacer layer 15', and the third spacer layer 19'.

Figure 2:
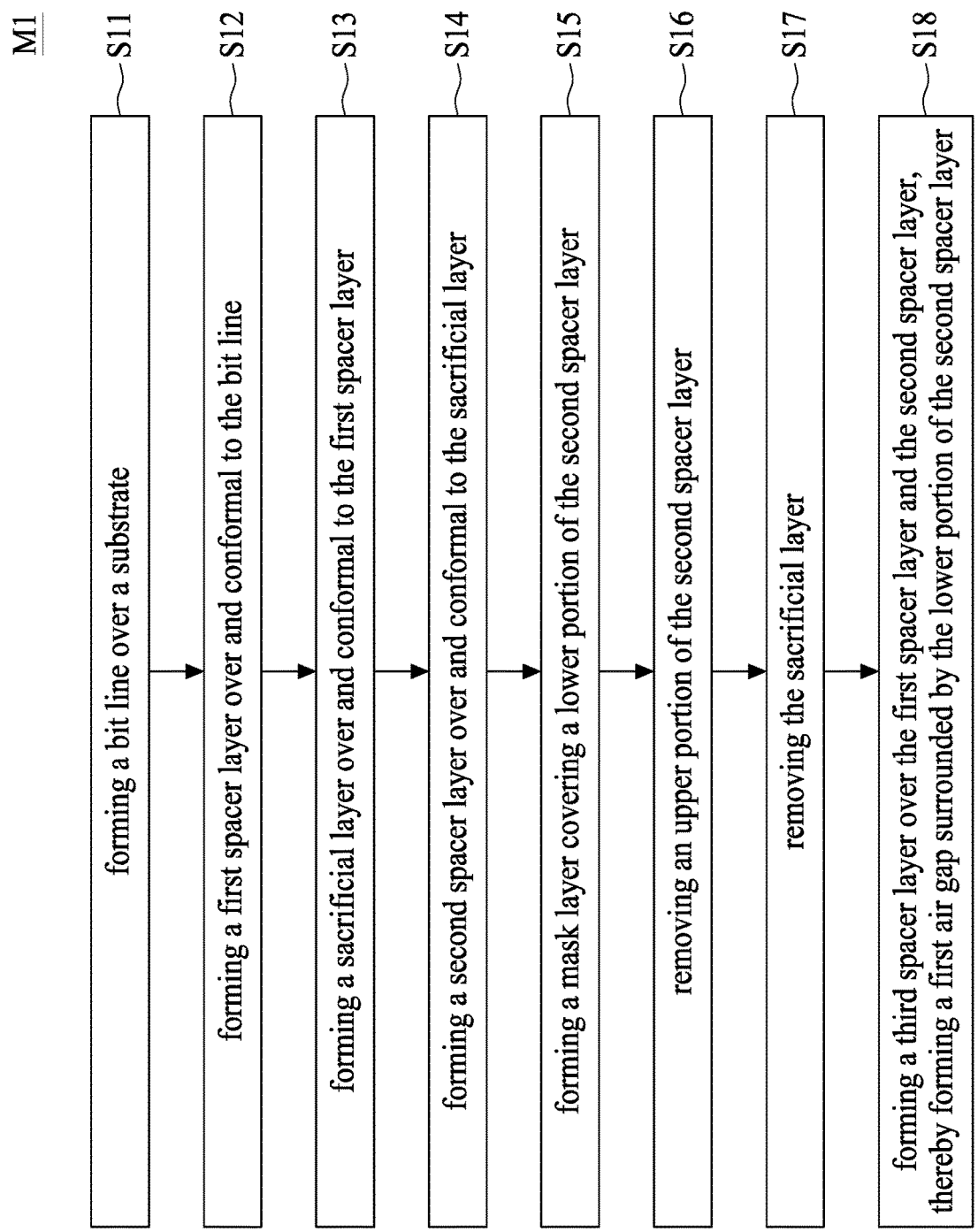
FIG. 2 is a flow diagram illustrating a method of manufacturing a semiconductor structure in accordance with some embodiments of the present disclosure.

FIG. 2 is a flow diagram of a method M1 for manufacturing a semiconductor structure 2, which is similar to the semiconductor structure 1 shown in FIG. 1. The method M1 includes: (S11) forming a bit line over a substrate; (S12) forming a first spacer layer over and conformal to the bit line; (S13) forming a sacrificial layer over and conformal to the first spacer layer; (S14) forming a second spacer layer over and conformal to the sacrificial layer; (S15) forming a mask layer covering a lower portion of the second spacer layer; (S16) removing an upper portion of the second spacer layer; (S17) removing the sacrificial layer; and (S18) forming a third spacer layer over the first spacer layer and the second spacer layer, thereby forming a first air gap surrounded by the lower portion of the second spacer layer. In some embodiments, the semiconductor structure 1 is also manufactured according to the method M1.

In order to further illustrate concepts of the present disclosure, various embodiments are provided below. For a purpose of clarity and simplicity, reference numbers of elements with same or similar functions are repeatedly used in different embodiments. However, such usage is not intended to limit the present disclosure to specific embodiments or specific elements. In addition, conditions or parameters illustrated in different embodiments can be combined or modified to have different combinations of embodiments as long as the parameters or conditions used are not conflicted.

Figure 3:
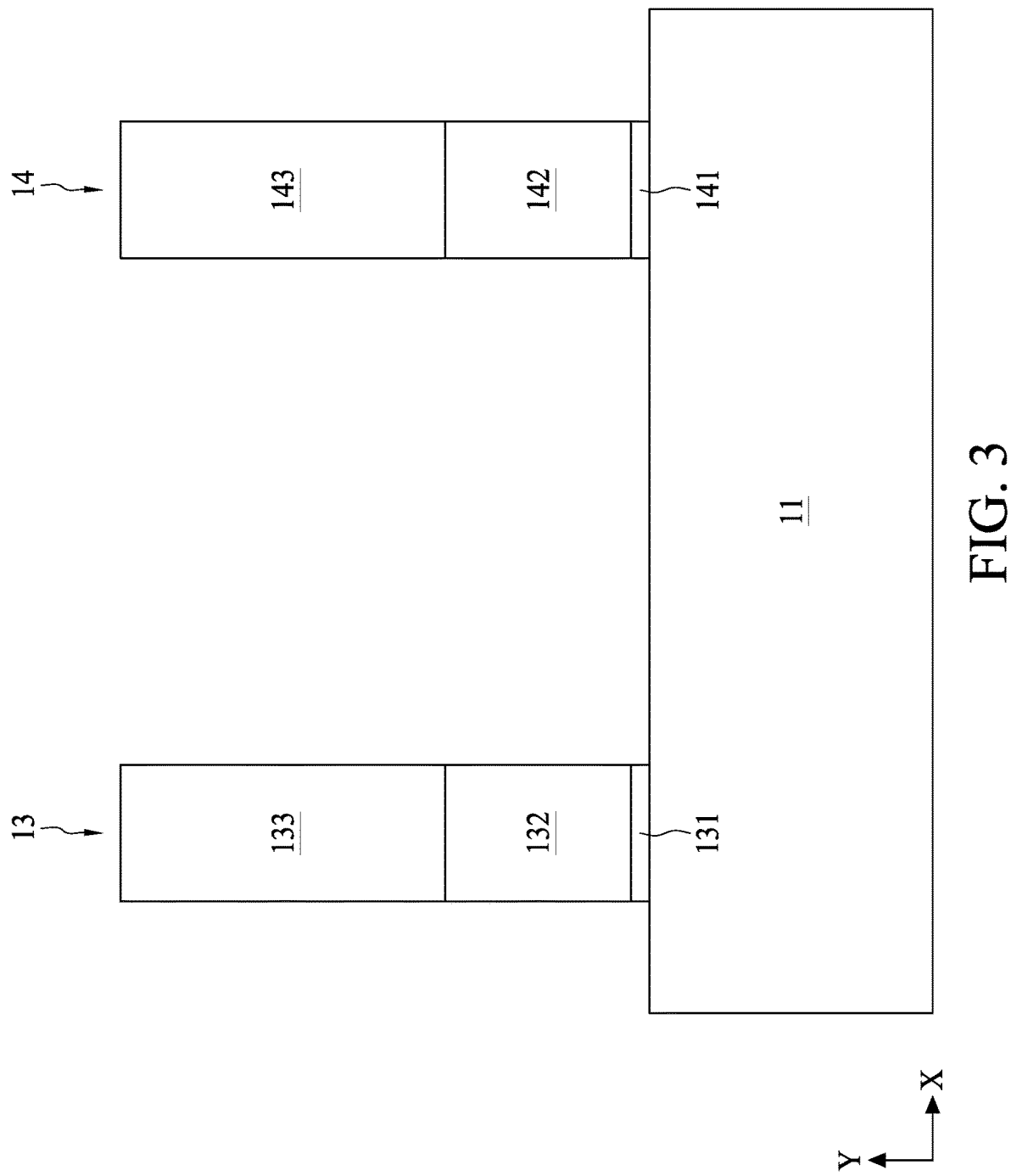
FIGS. 3 to 20 illustrate cross-sectional views of intermediate stages in the formation of a semiconductor structure in accordance with some embodiments of the present disclosure.

Referring to FIG. 3, in accordance with some embodiments of the present disclosure and the operation S11 of the method M1, a first bit line 13 and a second bit line 14 are formed on a substrate 11. In some embodiments, the first bit line 13 and the second bit line 14 are adjacent. In some embodiments, the first bit line 13 is a multi-layered structure. In some embodiments, the first bit line 13 includes a nitride layer 131, a metal layer 132 and a mask layer 133 stacked in sequence on the substrate 11. In some embodiments, the second bit line 14 is formed concurrently with the first bit line 13. In some embodiments, the second bit line 14 is similar to the first bit line 13 and includes a nitride layer 141, a metal layer 142 and a mask layer 143 stacked in sequence on the substrate 11.

In some embodiments, the operation S11 includes: (S111) performing a first blanket deposition to form a blanket nitride layer over the substrate 11; (S112) performing a second blanket deposition to form a blanket metal layer over the blanket nitride layer; (S113) performing a third blanket deposition to form a blanket mask layer over the blanket metal layer; and (S114) patterning the blanket nitride layer, the blanket metal layer and the blanket mask layer to form a plurality of bit lines. It should be noted that the first bit line 13 and the second bit line 14 are exemplary of the plurality of bit lines. The semiconductor structures of the present invention may include more than two bit lines.

Thicknesses of the layers of the first bit line 13 and the second bit line 14 depend on different applications. For instance, a thickness of the metal layer 132 and a thickness of the metal layer 142 can be adjusted and may vary according to different generations of different devices. In some embodiments, the thickness of the metal layer 132 and the thickness of the metal layer 142 are substantially equal. However, the disclosure is not limited thereto. Details of arrangements of stacked materials of the first bit line 13 and the second bit line 14 are not limited herein and can be adjusted according to different applications.

Figure 4:
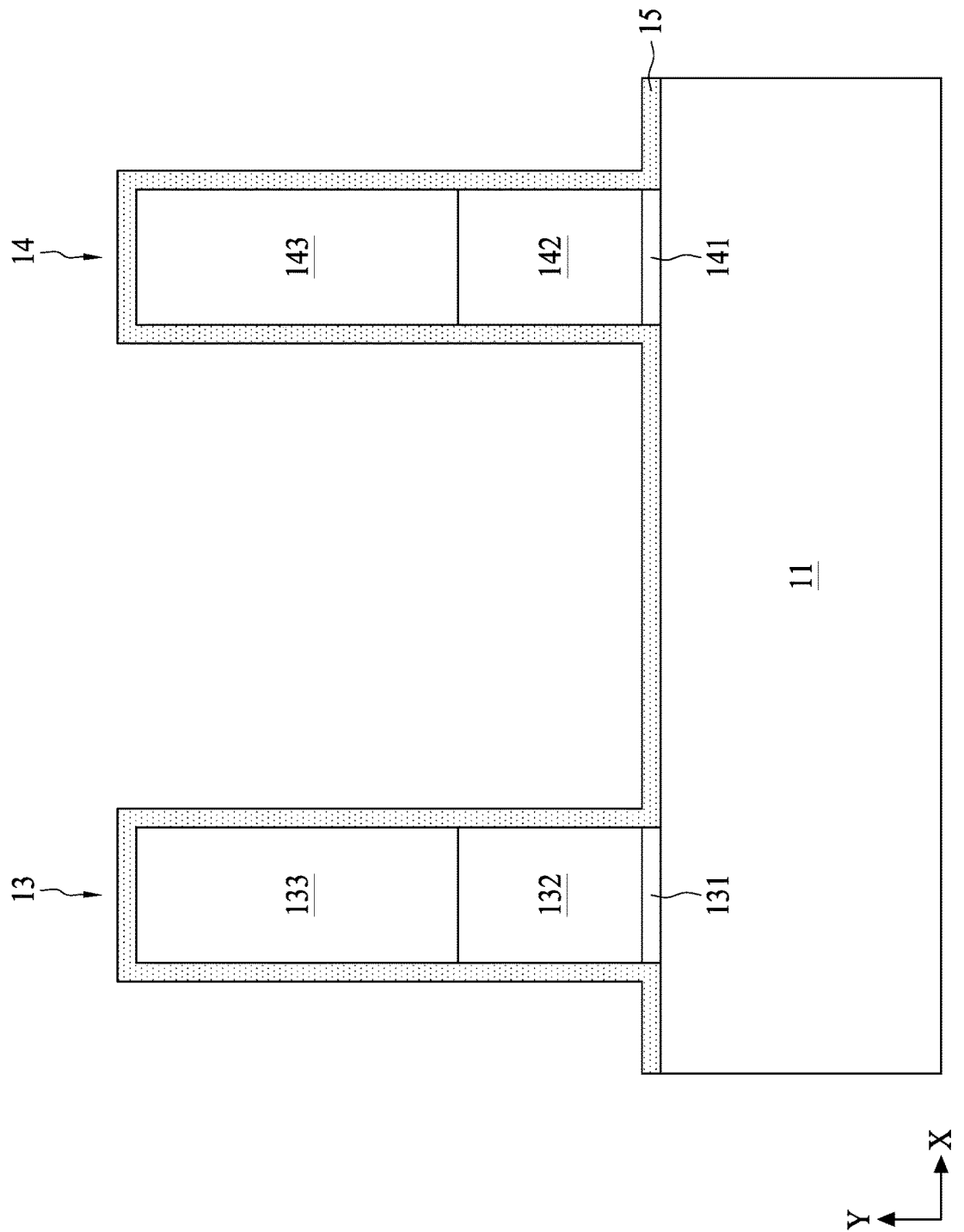

Referring to FIG. 4, in accordance with some embodiments of the present disclosure and the operation S12 of the method M1, a first spacer layer 15 is formed conformally over the first bit line 13 and the second bit line 14. In some embodiments, a lateral portion the first spacer layer 15 is in contact with the substrate 11. In some embodiments, the first spacer layer 15 is conformal to a profile of the first bit line 13, the second bit line 14, and the substrate 11. In some embodiments, the first spacer layer 15 is formed by a deposition of a nitride layer. In some embodiments, the first spacer layer 15 is formed by an atomic layer deposition (ALD). In some embodiments, a thickness of the first spacer layer 15 is between 4 and 8 nanometers.

Figure 5:
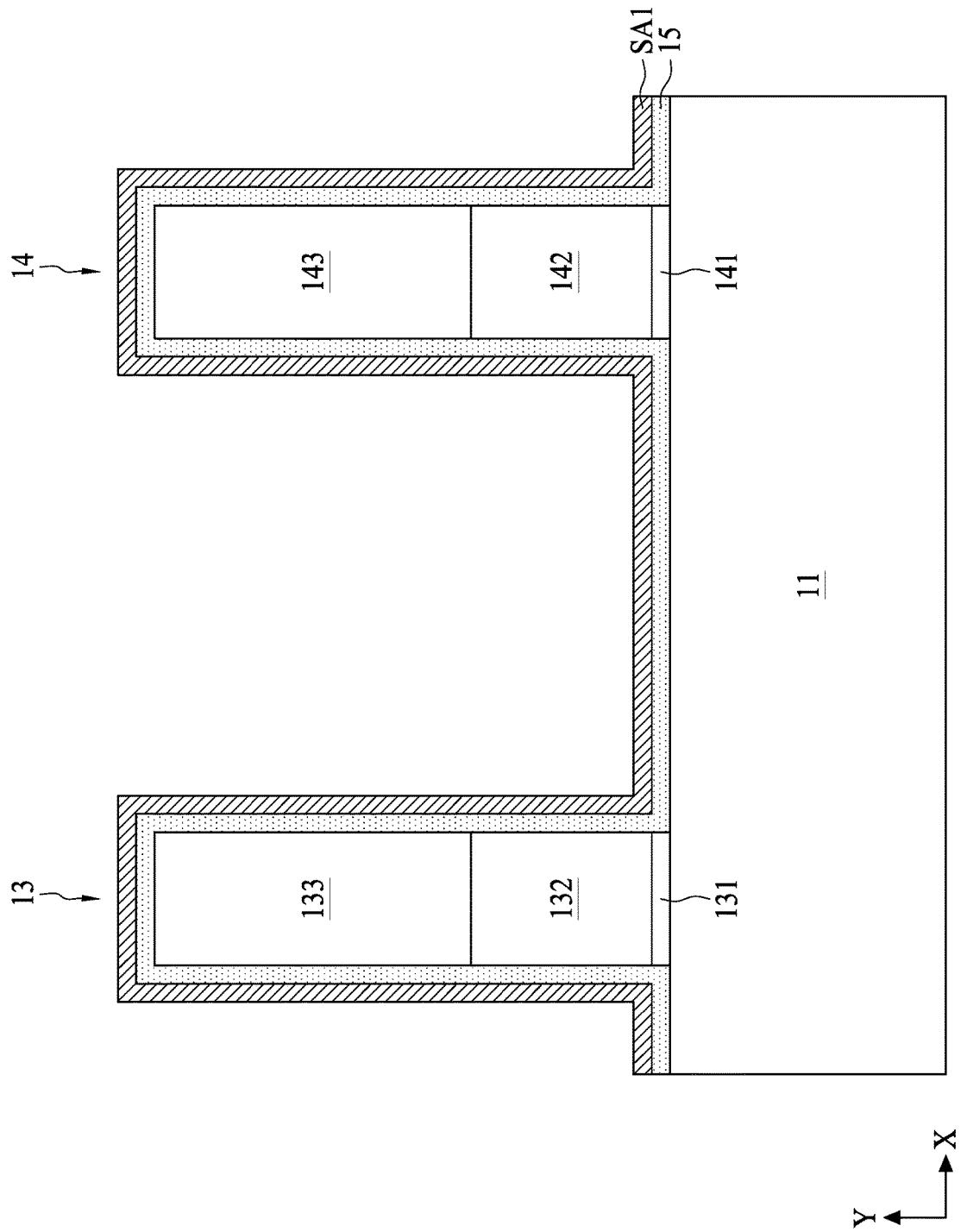

Referring to FIG. 5, in accordance with some embodiments of the present disclosure and the operation S13 of the method M1, a sacrificial layer SA1 is formed conformally over the first spacer layer 15. In some embodiments, the sacrificial layer SA1 is formed by a conformal deposition. In some embodiments, the sacrificial layer SA1 is formed by an atomic layer deposition (ALD). In some embodiments, the sacrificial layer SA1 conformally covers the substrate 11, the first bit line 13 and the second bit line 14. In some embodiments, the sacrificial layer SA1 has a profile conformal to the first spacer layer 15. In some embodiments, the sacrificial layer SA1 is a dielectric layer. In some embodiments, the sacrificial layer SA1 includes a dielectric material different from that of the first spacer layer 15. In some embodiments, the sacrificial layer SA1 is an oxide layer. In some embodiments, the sacrificial layer SA1 includes silicon oxide. In some embodiments, a thickness of the sacrificial layer SA1 is less than the thickness of the first spacer layer 15. In some embodiments, the thickness of the sacrificial layer SA1 is between 1 and 3 nanometers. In some embodiments, the thickness of the sacrificial layer SA1 serves to define a width of an air gap to be formed later in the process.

Figure 6:
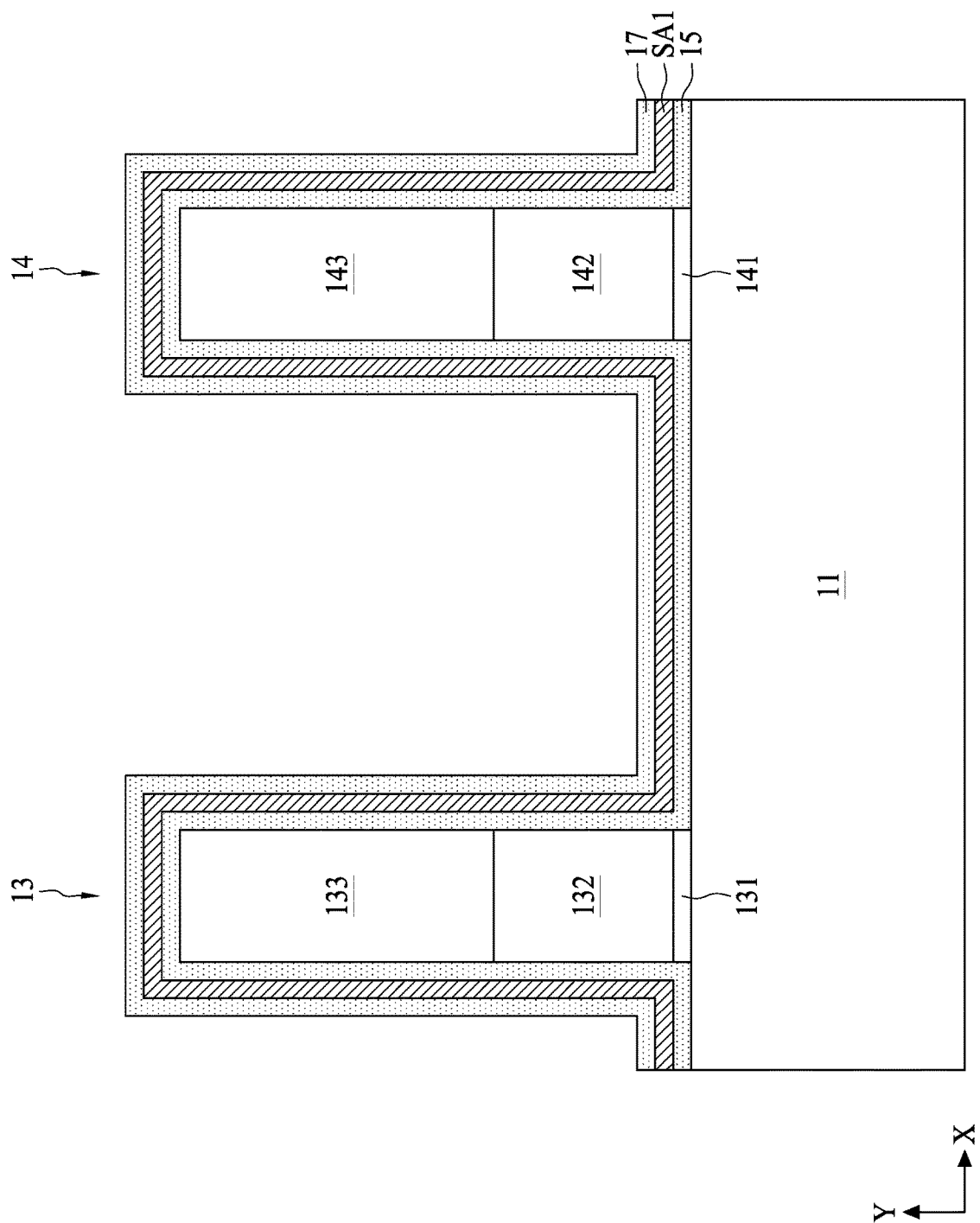

Referring to FIG. 6, in accordance with some embodiments of the present disclosure and the operation S14 of the method M1, a second spacer layer 17 is formed conformally over the sacrificial layer SA1. In some embodiments, the second spacer layer 17 is formed by a conformal deposition. In some embodiments, the second spacer layer 17 is formed by an atomic layer deposition (ALD). In some embodiments, the second spacer layer 17 conformally covers the substrate 11, the first bit line 13 and the second bit line 14. In some embodiments, the second spacer layer 17 has a profile conformal to the sacrificial layer SA1. In some embodiments, the second spacer layer 17 is a dielectric layer. In some embodiments, the second spacer layer 17 includes a dielectric material different from that of the sacrificial layer SA1. In some embodiments, the second spacer layer 17 includes a dielectric material same as that of the first spacer layer 15. In some embodiments, the second spacer layer 17 is a nitride layer. In some embodiments, the second spacer layer 17 includes silicon nitride. In some embodiments, a thickness of the second spacer layer 17 is greater than a thickness of the sacrificial layer SA1. In some embodiments, the thickness of the second spacer layer 17 is substantially equal to the thickness of the first spacer layer 15. In some embodiments, the thickness of the second spacer layer 17 is between 4 and 8 nanometers.

Figure 7:
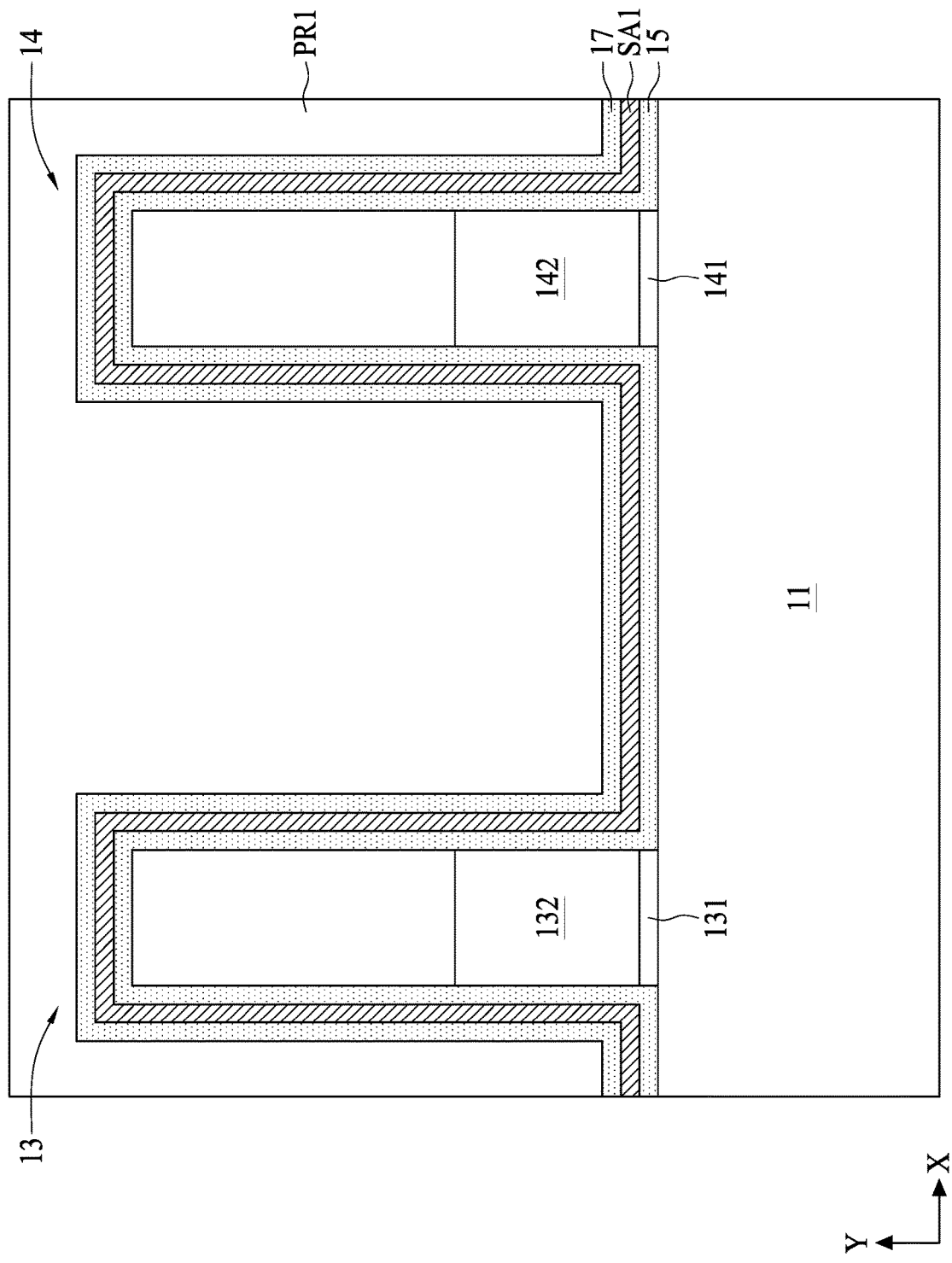
Figure 8:
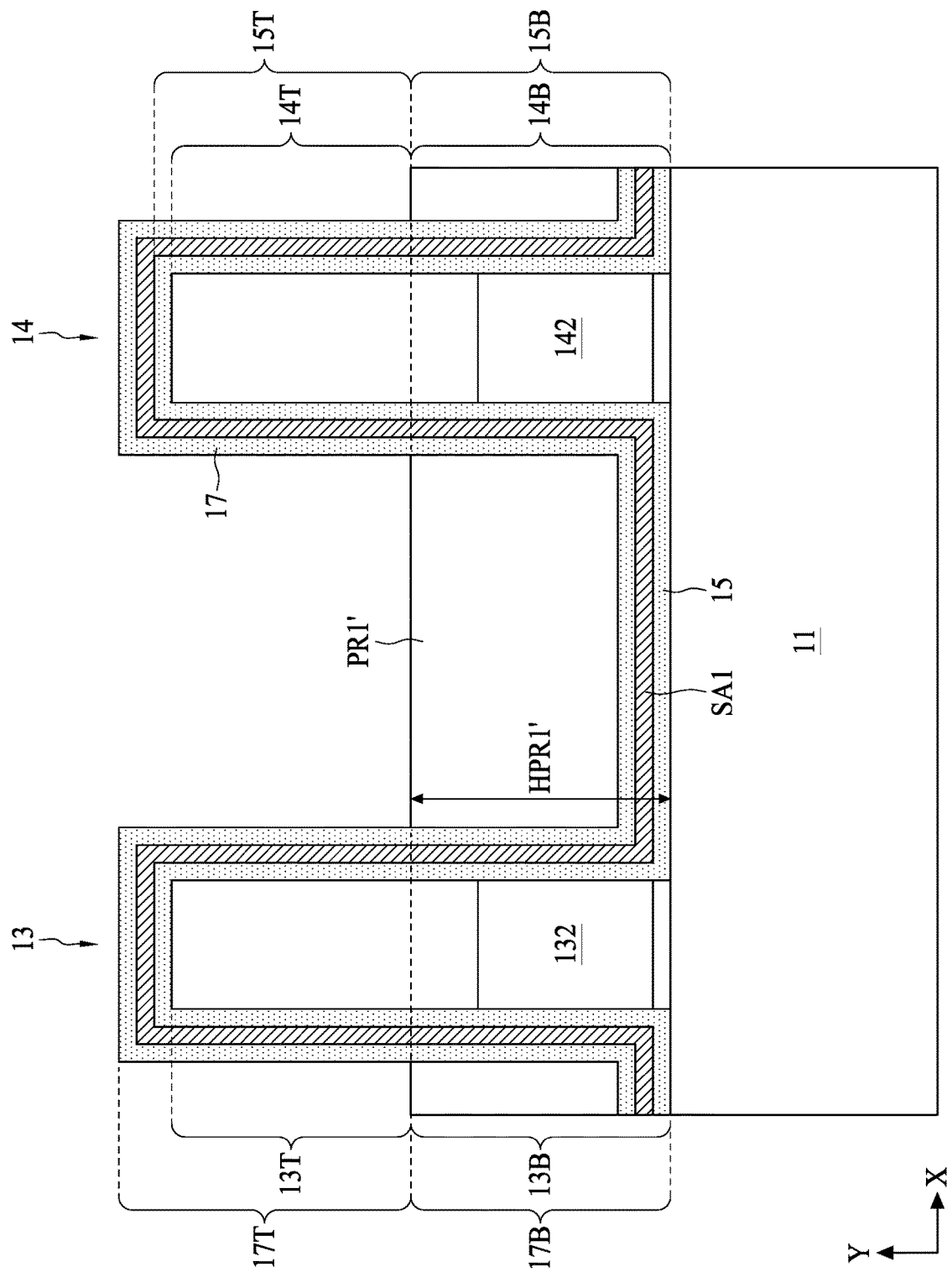

Referring to FIGS. 7 to 8, in accordance with some embodiments of the present disclosure and the operation S15 of the method M1, a photoresist PR1 is formed and covers a lower portion of the second spacer layer 17. The photoresist PR1 serves to define a height of the lower portion of the second spacer layer 17 and also defines a height of an air gap to be formed later in the process. In some embodiments, the photoresist PR1 can be any type of mask layer or protective layer. In some embodiments, the operation S15 includes multiple steps: (S151) forming a photoresist PR1; and (S152) removing a portion of the photoresist PR1, thereby exposing an upper portion of the second spacer layer 17.

Referring to FIG. 7, in accordance with some embodiments of the present disclosure and the step S151 of the operation S15 of the method M1, the photoresist PR1 is formed covering the first bit line 13, the second bit line 14 and the substrate 11. In some embodiments, the photoresist PR1 covers the second spacer layer 17.

Referring to FIG. 8, in accordance with some embodiments of the present disclosure and the step S152 of the operation S15 of the method M1, a portion of the photoresist PR1 surrounding an upper portion 17T of the second spacer layer 17 is removed. A remaining portion of the photoresist PR1 becomes a photoresist PR1' surrounding a lower portion 17B of the second spacer layer 17. The photoresist PR1' serves to define a height of an air gap to be formed later in the process.

A height HPR1' measured from a top of the photoresist PR1' to the substrate 11 is designed to be greater than or equal to the height H132 of the metal layer 132 measured from the top of the metal layer 132 to the substrate 11. The height HPR1' is also designed to be greater than or equal to the height H142 of the metal layer 142 measured from the top of the metal layer 142 to the substrate 11. In some embodiments, an upper portion 17T of the second spacer layer 17, an upper portion of the sacrificial layer SA1, an upper portion 15T of the first spacer layer 15, an upper portion 13T of the first bit line 13 and an upper portion 14T of the second bit line 14 are exposed through the photoresist PR1'. In some embodiments, a lower portion 17B of the second spacer layer 17, a lower portion of the sacrificial layer SA1, a lower portion 15B of the first spacer layer 15, a lower portion 13B of the first bit line 13 and a lower portion 14B of the second bit line 14 are surrounded by the photoresist PR1'. In some embodiments, a thickness of the photoresist PR1' is in a range of 80 to 130 nanometers.

Figure 9:
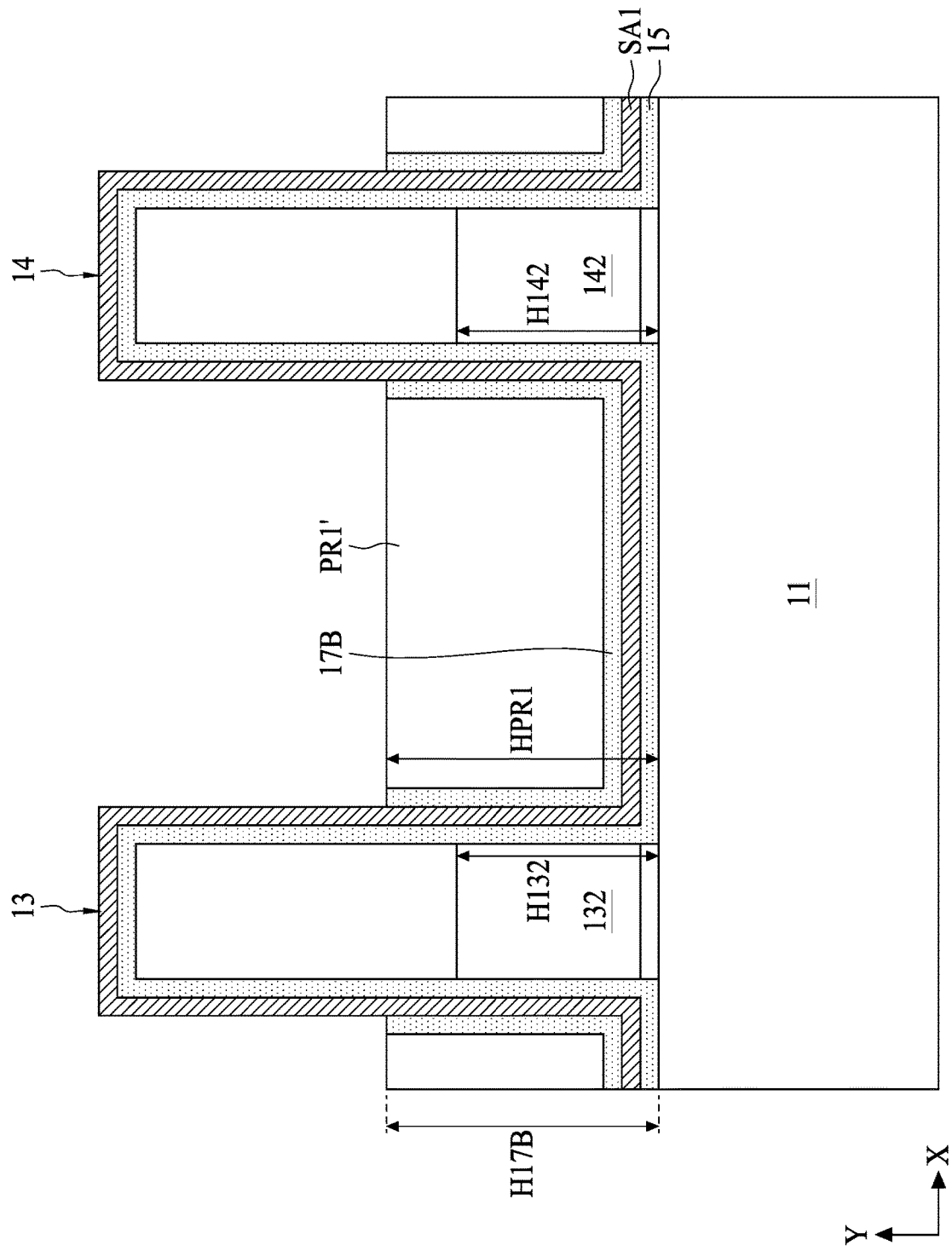

Referring to FIG. 9, in accordance with some embodiments of the present disclosure and the operation S16 of the method M1, the upper portion 17T of the second spacer layer 17 is removed. An upper portion of the sacrificial layer SA1 is exposed through the lower portion 17B of the second spacer layer 17. In some embodiments, a dry etch is performed to remove the upper portion 17T of the second spacer layer 17. For ease of illustration, the lower portion 17B of the second spacer layer 17 in the intermediate structures formed after the operation S16 is referred to as the second spacer layer 17B.

A height H17B of the second spacer layer 17B measured from the substrate 11 is defined by the photoresist PR1'. As shown in FIG. 9, the height HPR1' of the photoresist PR1' and the height H17B are substantially equal. In some embodiments, the height H17B of the second spacer layer 17B is designed to be equal to or greater than the height H132 of the metal layer 132 and/or the height H142 of the metal layer 142, wherein the height H132 and the height H142 are measured from the substrate 11. In some embodiments, the second spacer layer 17B surrounds at least the metal layer 132 of the first bit line 13. In some embodiments, the second spacer layer 17B surrounds at least the metal layer 142 of the second bit line 14.

Figure 10:
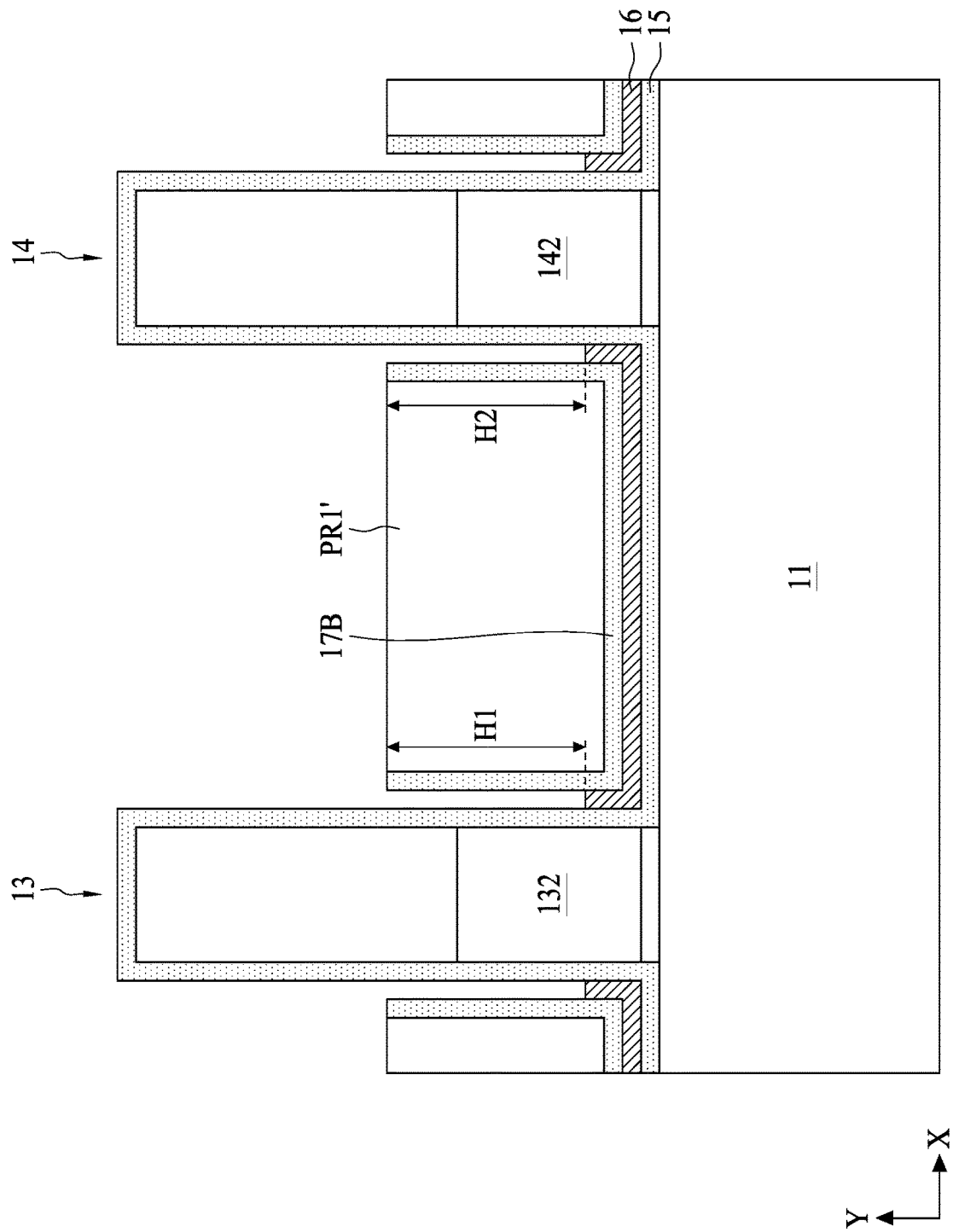

Referring to FIG. 10, in accordance with some embodiments of the present disclosure and the operation S17 of the method M1, a portion of the sacrificial layer SA1 is removed. In some embodiments, an upper portion of the sacrificial layer SA1 exposed through the photoresist PR1' or the second spacer layer 17B is removed. In some embodiments, at least a part of a vertical portion of the sacrificial layer SA1 lower than the top of the photoresist PR1' or the top of the second spacer layer 17B is also removed. In some embodiments, a wet etch is performed to remove the upper portion and the vertical portion of the sacrificial layer SA1. In some embodiments, an etchant with a high nitride-to-oxide etching rate is used in the wet etch. A remaining portion of the sacrificial layer SA1 becomes a dielectric layer 16. In some embodiments, the dielectric layer 16 extends horizontally between the first spacer layer 15 and the second spacer layer 17B. In some embodiments, an entirety of the dielectric layer 16 is disposed lower than the top of the photoresist PR1' or below the top of the second spacer layer 17B. In some embodiments, a distance H1 between a top of the dielectric layer 16 and the top of the second spacer layer 17B measured adjacent to the first bit line 13 is in a range of 60 to 100 nanometers. In some embodiments, a distance H2 between the top of the dielectric layer 16 and the top of the second spacer layer 17B measured adjacent to the second bit line 14 is in a range of 60 to 100 nanometers. In some embodiments, a native dielectric layer is formed conformally covering the first spacer layer 15 and the second spacer layer 17B (not shown). In some embodiments, the native dielectric layer includes oxide.

Figure 11:
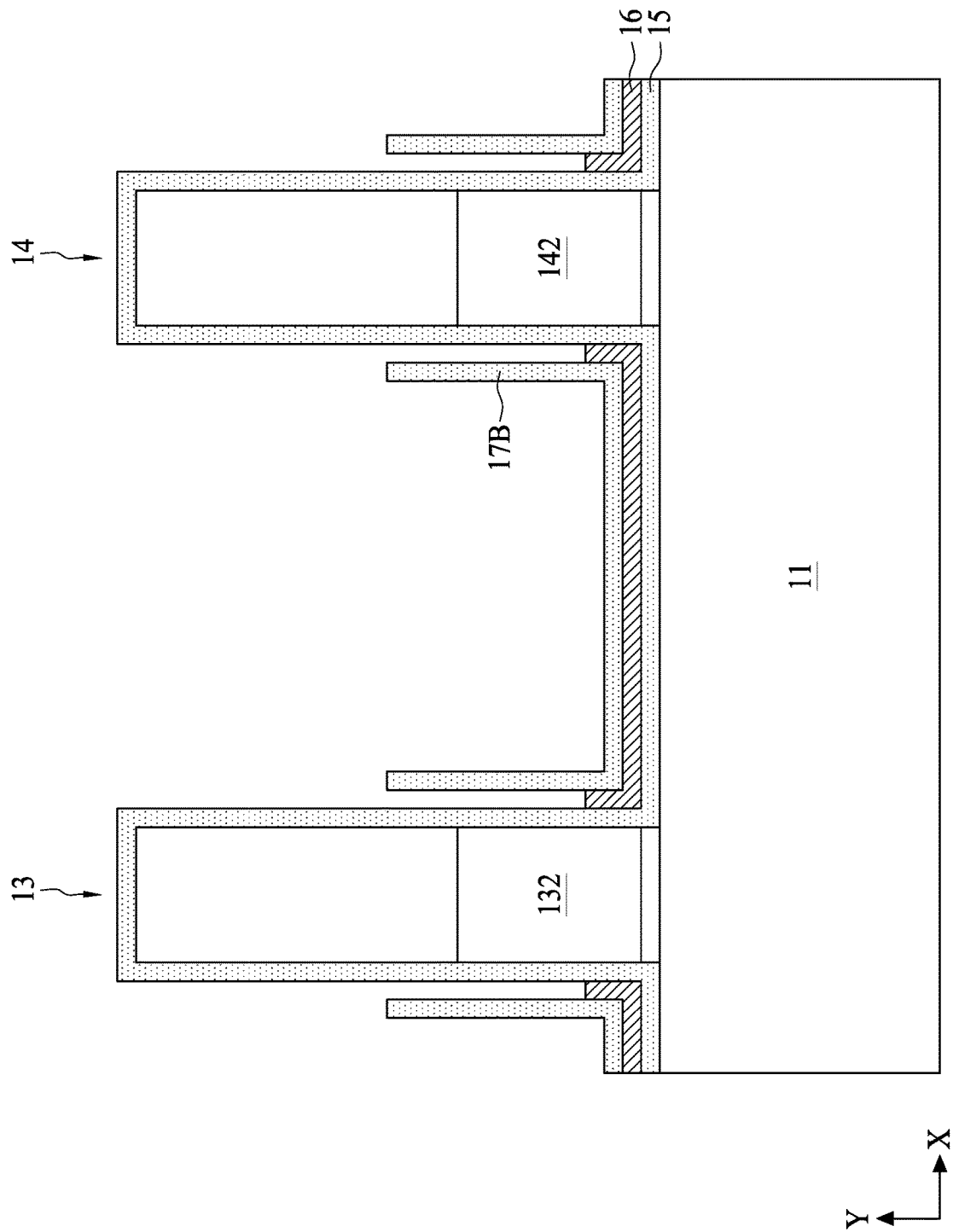

Referring to FIG. 11, in accordance with some embodiments of the present disclosure, after the operation S17, the method M1 further includes removing the photoresist PR1'. In some embodiments, an etching operation is performed to remove the photoresist PR1'. In some embodiments, a vapor pressure of the etching operation is controlled during the removal of the photoresist PR1' to avoid damaging or peeling off of the second spacer layer 17B. In some embodiments, after the operation S17, a native dielectric layer is further formed conformally over a portion of the second spacer layer 17B that was previously covered by the photoresist PR1' (not shown).

Figure 12:
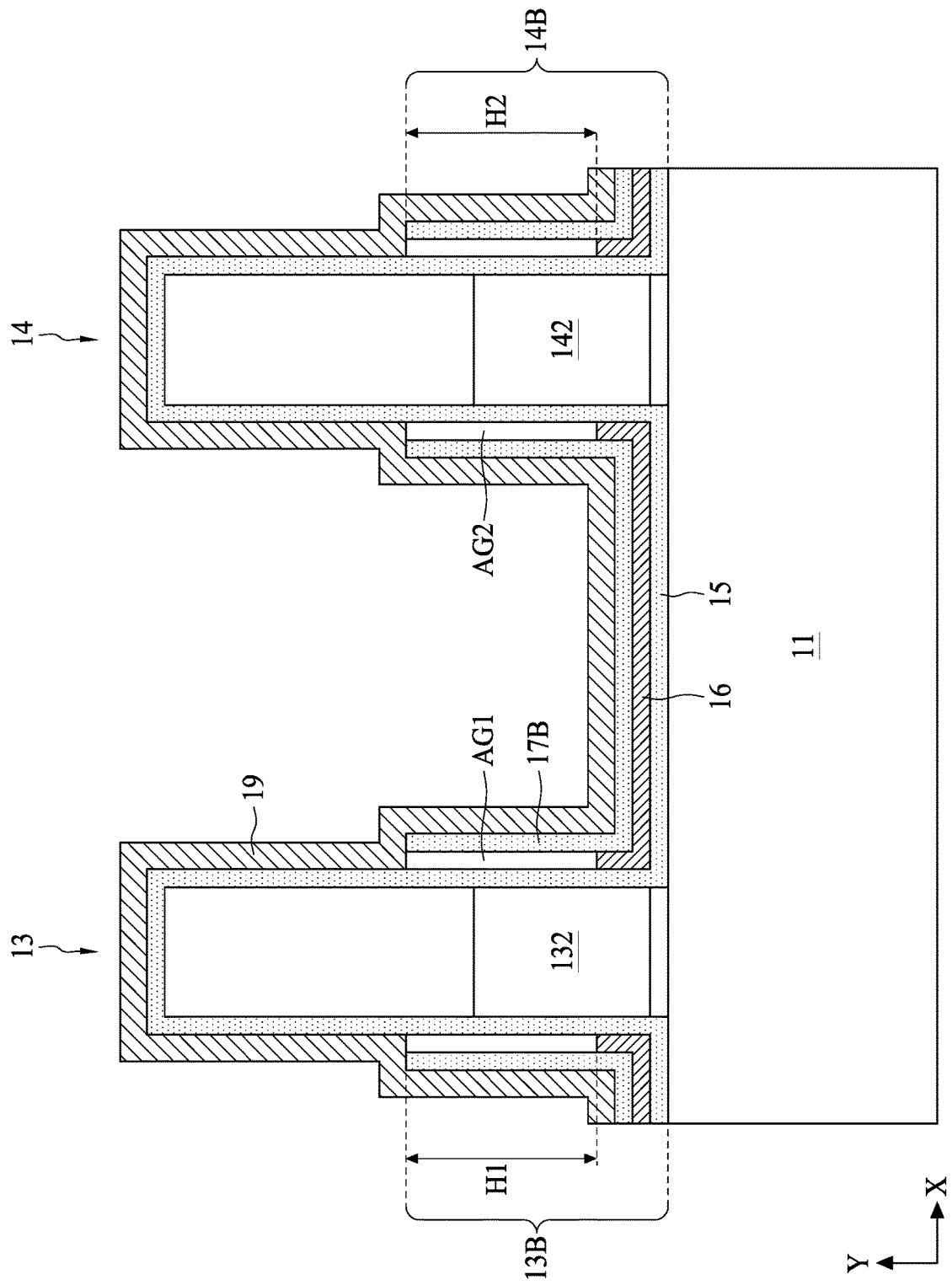

Referring to FIG. 12, in accordance with some embodiments of the present disclosure and the operation S18 of the method M1, a third spacer layer 19 is formed over the first spacer layer 15 and the second spacer layer 17B, thereby forming an air gap AG1 and an air gap AG2. The air gap AG1 and the air gap AG2 are sealed by the third spacer layer 19 and surrounded by the second spacer layer 17B. In some embodiments, the air gap AG1 is elongated along the first bit line 13 and perpendicular to the substrate 11. In some embodiments, the air gap AG2 is elongated along the second bit line 14 and perpendicular to the substrate 11. In some embodiments, a height of the air gap AG1 and a height of the air gap AG2 are defined by the removed portion overlapping the first spacer layer 15 and the second spacer layer 17B. In some embodiments, the height of the air gap AG1 is substantially equal to the height H1, and the height of the air gap AG2 is substantially equal to the height H2. For a purpose of simplicity, the height H1 can also represent the height of the air gap AG1, and the height H2 can also represent the height of the air gap AG2 in the following specification.

In some embodiments, the air gap AG1 surrounds the lower portion 13B of the first bit line 13. In some embodiments, the air gap AG2 surrounds the lower portion 14B of the second bit line 14. In some embodiments, a thickness of the third spacer layer 19 is greater than a width of the air gap AG1 (or a thickness of the dielectric layer 16 since the width of the air gap AG1 is defined by the sacrificial layer SA1). Similarly, in some embodiments, the thickness of the third spacer layer 19 is greater than a width of the air gap AG2 (or a thickness of the dielectric layer 16). In some embodiments, the third spacer layer 19 is formed by a deposition operation. In some embodiments, the third spacer layer 19 is formed by a chemical vapor deposition. In some embodiments, a deposition rate in the formation of the third spacer layer 19 is greater than a deposition rate in the formation of the sacrificial layer SA1. In some embodiments, the third spacer layer 19 does is not formed between the first spacer layer 15 and the second spacer layer 17B. In some embodiments, the third spacer layer 19 is conformal to a profile of the first spacer layer 15, the second spacer layer 17B, the air gap AG1 and the air gap AG2. In some embodiments, the third spacer layer 19 is a dielectric layer. In some embodiments, the third spacer layer 19 includes a dielectric material same as the second spacer layer 17B or the first spacer layer 15. In some embodiments, the third spacer layer 19 is a nitride layer. In some embodiments, the third spacer layer 19 includes silicon nitride. In some embodiments, a thickness of the third spacer layer 19 is between 6 and 10 nanometers.

Figure 13:
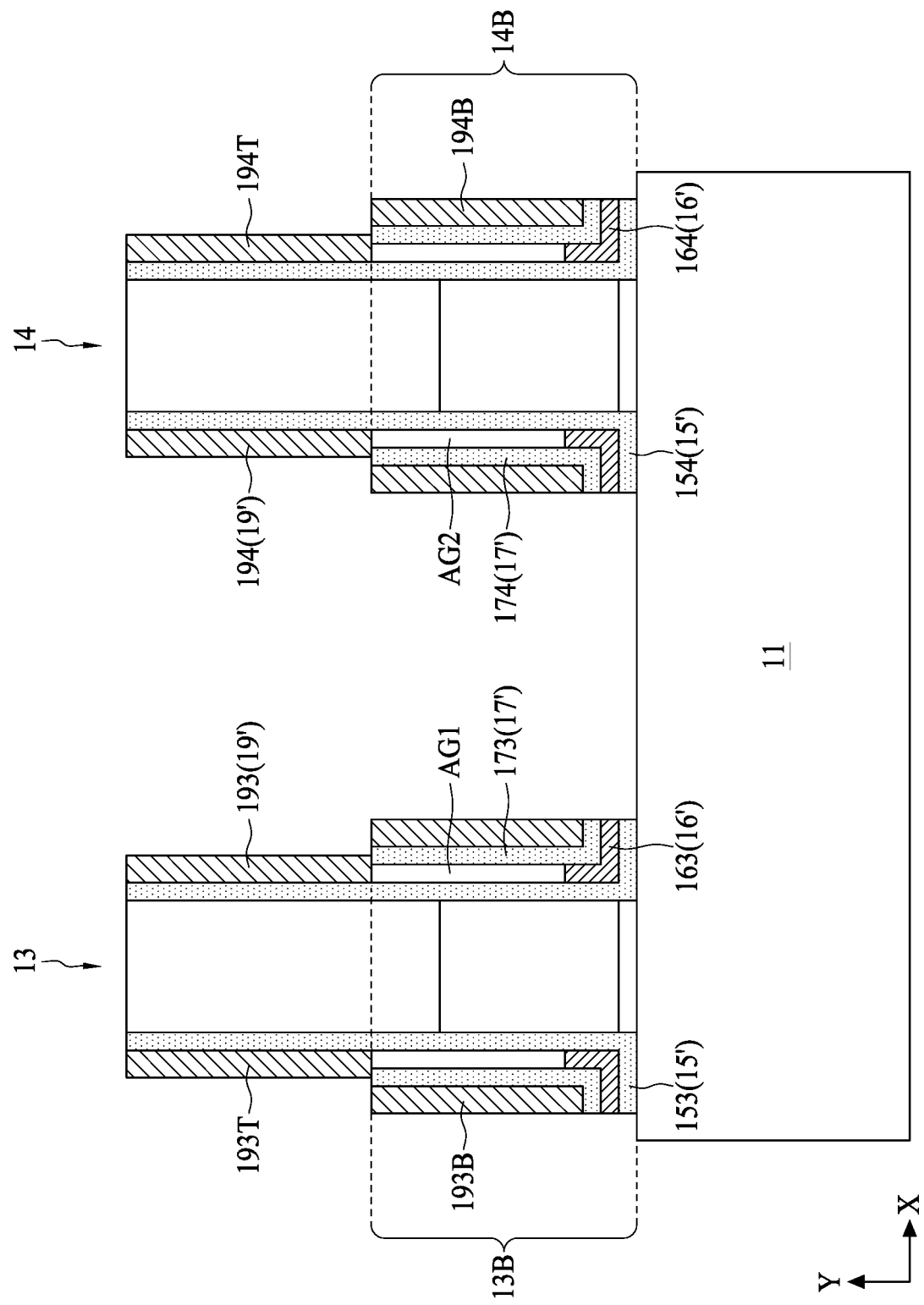

Referring to FIG. 13, in accordance with some embodiments of the present disclosure, after the operation S18, the method M1 may further include (S19) exposing the substrate 11 between the first bit line 13 and the second bit line 14. In some embodiments, lateral portions of the third spacer layer 19, the second spacer layer 17B, the dielectric layer 16, and the first spacer layer 15 are removed. In some embodiments, lateral portions of the third spacer layer 19 disposed between the first bit line 13 and the second bit line 14, on a top of the first bit line 13, and on a top of the second bit line 14 are removed, thereby forming an etched third spacer layer 19'. In some embodiments, a lateral portion of the second spacer layer 17B on the substrate 11 between the first bit line 13 and the second bit line 14 and exposed through the third spacer layer 19' is removed, thereby forming an etched second spacer layer 17'. In some embodiments, a lateral portion of the dielectric layer 16 on the substrate 11 between the first bit line 13 and the second bit line 14 and exposed through the second spacer layer 17' is removed, thereby forming an etched dielectric layer 16'. In some embodiments, a lateral portion of the first spacer layer 15 on the substrate 11 between the first bit line 13 and the second bit line 14 exposed through the dielectric layer 16' is removed, and lateral portions of the first spacer layer 15 on the tops of the first bit line 13 and the second bit line 14 exposed through the third spacer layer 19' are also removed, thereby forming an etched first spacer layer 15'.

In some embodiments, during the operation S19, each of the first spacer layer 15', the dielectric layer 16', the second spacer layer 17' and the third spacer layer 19' is divided into different portions surrounding the first bit line 13 and the second bit line 14 respectively. In some embodiments, a first partial layer 153 of the first spacer layer 15', a first partial layer 163 of the dielectric layer 16', the air gap AG1, a first partial layer 173 of the second spacer layer 17' and a first partial layer 193 of the third spacer layer 19' together can be defined as a first spacer structure surrounding the first bit line 13. In some embodiments, a second partial layer 154 of the first spacer layer 15', a second partial layer 164 of the dielectric layer 16', the air gap AG2, a second partial layer 174 of the second spacer layer 17' and a second partial layer 194 of the third spacer layer 19' together can be defined as a second spacer structure surrounding the second bit line 14.

In some embodiments, the first partial layer 193 of the third spacer layer 19' is divided into an upper portion 193T above the air gap AG1 and a lower portion 193B surrounding the air gap AG1. In some embodiments, a lateral portion of the first partial layer 193 disposed over a top of the first partial layer 173 of the second spacer layer 17B is also removed during the operation S19, and the top of the first partial layer 173 is exposed. In such embodiments, the first partial layer 193 is divided into two discontinuous portions, in which the upper portion 193T and the lower portion 193B are separated as shown in FIG. 13. In other embodiments, the top of the second spacer layer 17B is entirely covered by a vertical portion of the third spacer layer 19' due to a greater thickness of the third spacer layer 19', which results in a full coverage of the upper portion 193T over the top of the first partial layer 173. In such embodiments, the first partial layer 193 is a continuous and stepped layer, in which the upper portion 193T and the lower portion 193B are connected.

Similarly, in some embodiments, the second partial layer 194 of the third spacer layer 19' is divided into an upper portion 194T above the air gap AG2 and a lower portion 194B surrounding the air gap AG2. In some embodiments, a lateral portion of the second partial layer 194 disposed over a top of the second partial layer 174 is also removed during the operation S19, and the top of the second partial layer 174 is exposed. In such embodiments, the second partial layer 194 is divided into two discontinuous portions, in which the upper portion 194T and the lower portion 194B are separated as shown in FIG. 13. In other embodiments, the top of the second spacer layer 17B is entirely covered by a vertical portion of the third spacer layer 19' due to a greater thickness of the third spacer layer 19', which results in a full coverage of the upper portion 194T over the top of the second partial layer 174. In such embodiments, the second partial layer 194 is a continuous and stepped layer, and the upper portion 194T and the lower portion 194B are connected.

In some embodiments, a thickness of the first spacer structure above the air gap AG1 is substantially equal to a total thickness of the first spacer layer 15' and the third spacer layer 19'. In some embodiments, a thickness of the first spacer structure at the air gap AG1 is substantially equal to a total thickness of the first spacer layer 15', the sacrificial layer SA1, the second spacer layer 17' and the third spacer layer 19'. The air gap AG1 and the first partial layer 173 of the second spacer layer 17' surround only the lower portion 13B of the first bit line 13, and thus the first spacer structure is tapered from the substrate 11 toward the top of the first bit line 13. Similarly, in some embodiments, a thickness of the second spacer structure above the air gap AG2 is substantially equal to the total thickness of the first spacer layer 15' and the third spacer layer 19'. In some embodiments, a thickness of the second spacer structure at the air gap AG2 is substantially equal to the total thickness of the first spacer layer 15', the sacrificial layer SA1, the second spacer layer 17' and the third spacer layer 19'. The air gap AG2 and the second partial layer 174 of the second spacer layer 17' surround only the lower portion 14B of the second bit line 14, and thus the second spacer structure is tapered from the substrate 11 toward the top of the second bit line 14.

In some embodiments, a single etching operation is performed to form the first spacer layer 15', the dielectric layer 16', the second spacer layer 17' and the third spacer layer 19'. In some embodiments, the first spacer layer 15', the dielectric layer 16', the second spacer layer 17' and the third spacer layer 19' are formed by multiple etching operations. In some embodiments, one or more dry etching operations are performed in the operation S19. In some embodiments, a top portion of the second spacer layer 17' exposed through the third spacer layer 19' is also removed during the operation S19. In some embodiments, the air gap AG1 and the air gap AG2 remain sealed by the third dielectric layer 19/19' during the operation S19 since the thickness of the third dielectric layer 19/19' is greater than the width of the air gap AG1 or the width of the air gap AG2.

Figure 14:
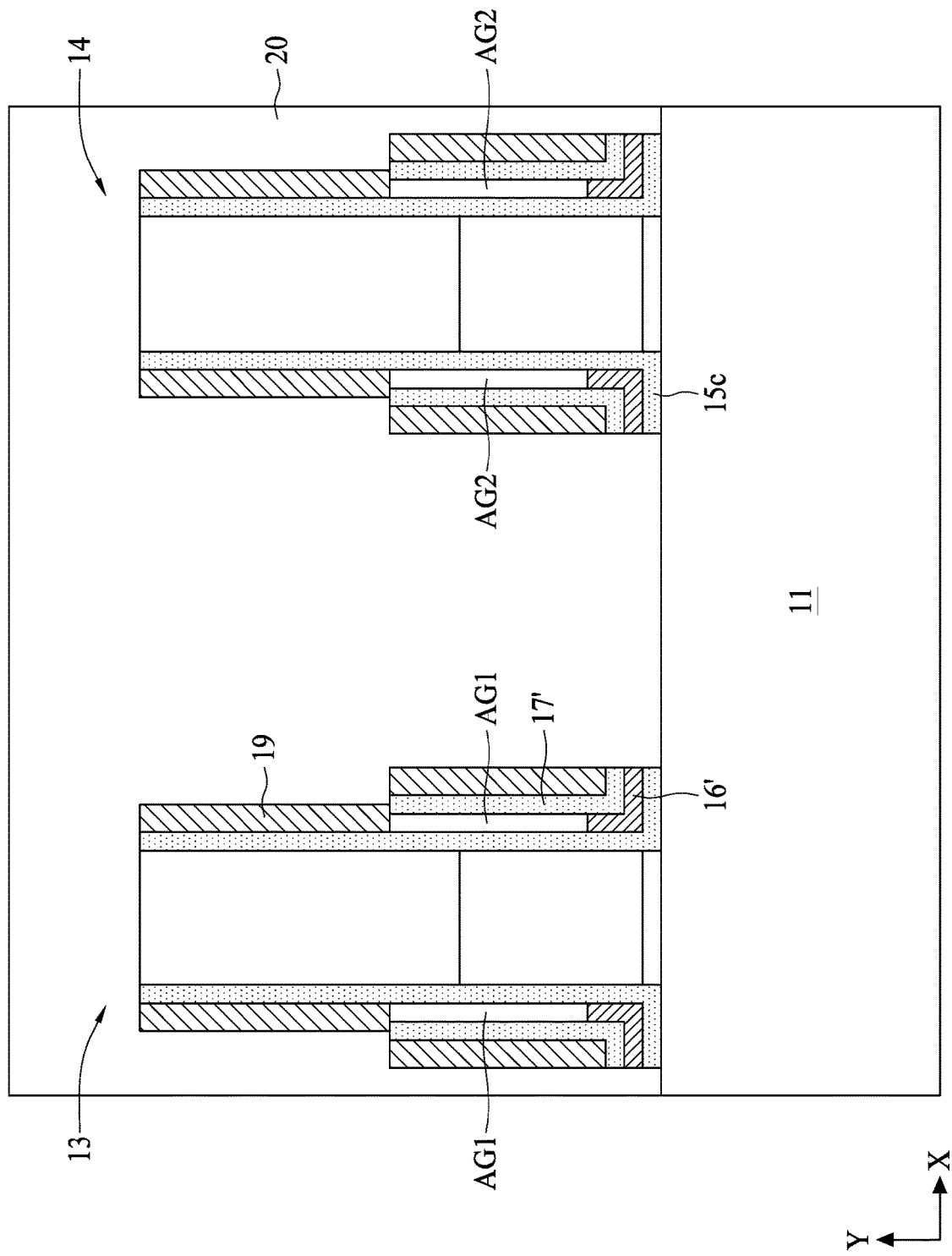
Figure 15:
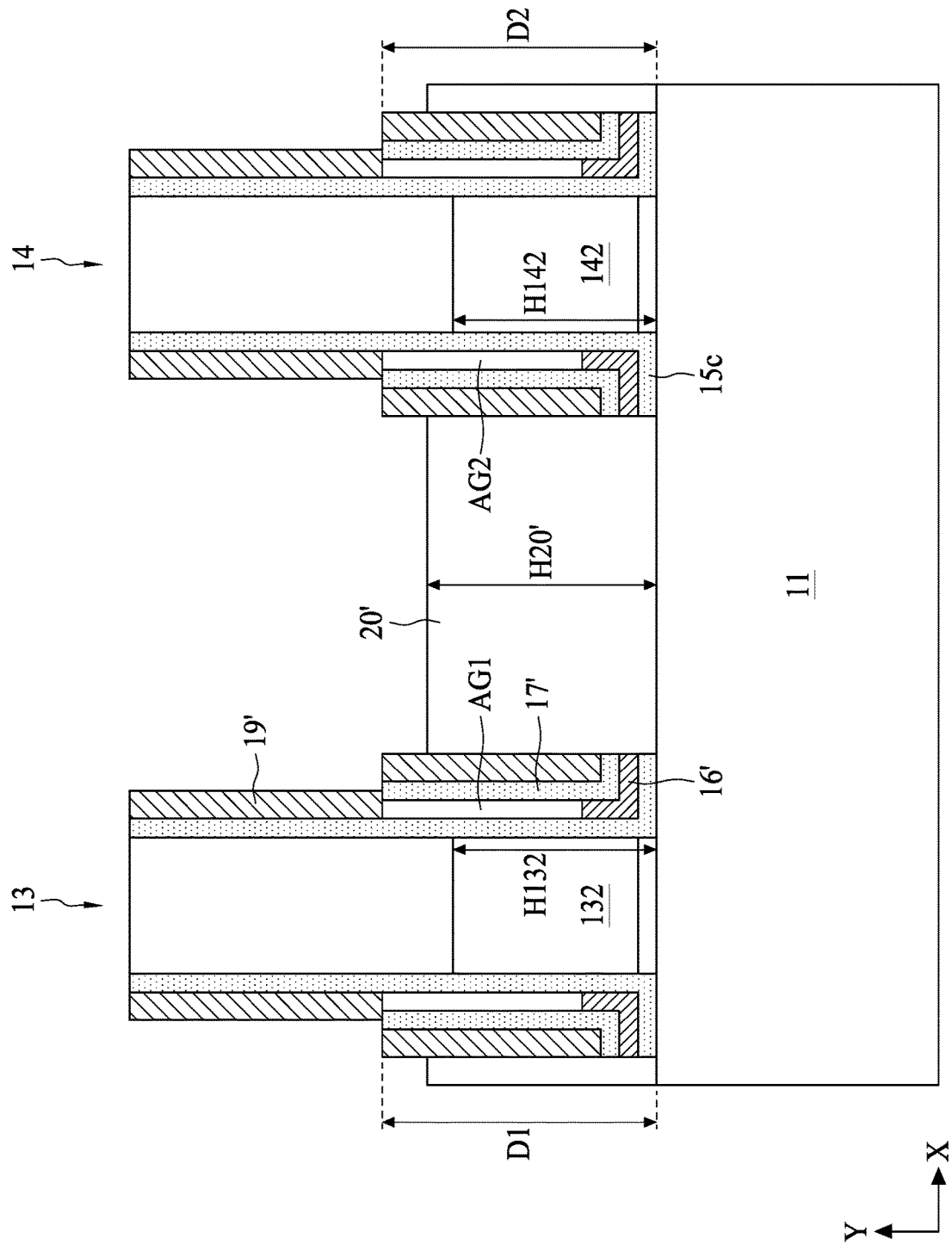

Referring to FIGS. 14 to 15, in accordance with some embodiments of the present disclosure, after the operation S19, the method M1 further includes: (S20) forming a contact 20' over the substrate 11. In some embodiments, the contact 20' is formed between the first bit line 13 and the second bit line 14. In some embodiments, the contact 20' is formed in physical contact with the substrate 11 in order to electrically connect to the substrate 11.

In some embodiments, the operation S20 of the method M1 includes: (S201) forming a contact material layer 20 covering the first bit line 13 and the second bit line 14; and (S202) removing a portion of the contact material layer 20 to form the contact 20'. In some embodiments, the contact material layer 20 includes doped polysilicon. In some embodiments, a blanket deposition is performed to form the contact material layer 20. In some embodiments, an etch-back operation is performed to remove the portion of the contact material layer 20, thereby forming the contact 20'.

In some embodiments, the contact 20' surrounds the first bit line 13 and the second bit line 14 as shown in FIG. 15. In some embodiments, a height H20' of the contact 20' above the substrate 11 is less than a distance D1 between a top of the air gap AG1 and the substrate 11. In some embodiments, the height H20' of the contact 20' is less than a distance D2 between a top of the air gap AG2 and the substrate 11. In some embodiments, the distance D1 is substantially equal to the distance D2 since the distance D1 and the distance D2 are both defined by the height HPR1' of the photoresist PR1' and/or the height H17B of the second spacer layer 17B. In some embodiments, the height H20' of the contact 20' is greater than the height H132 of the metal layer 132 of the first bit line 13. In some embodiments, the height H20' of the contact 20' is greater than the height H142 of the metal layer 142 of the second bit line 14. In some embodiments, the height H20' is between 20 and 60 nanometers.

Figure 16:
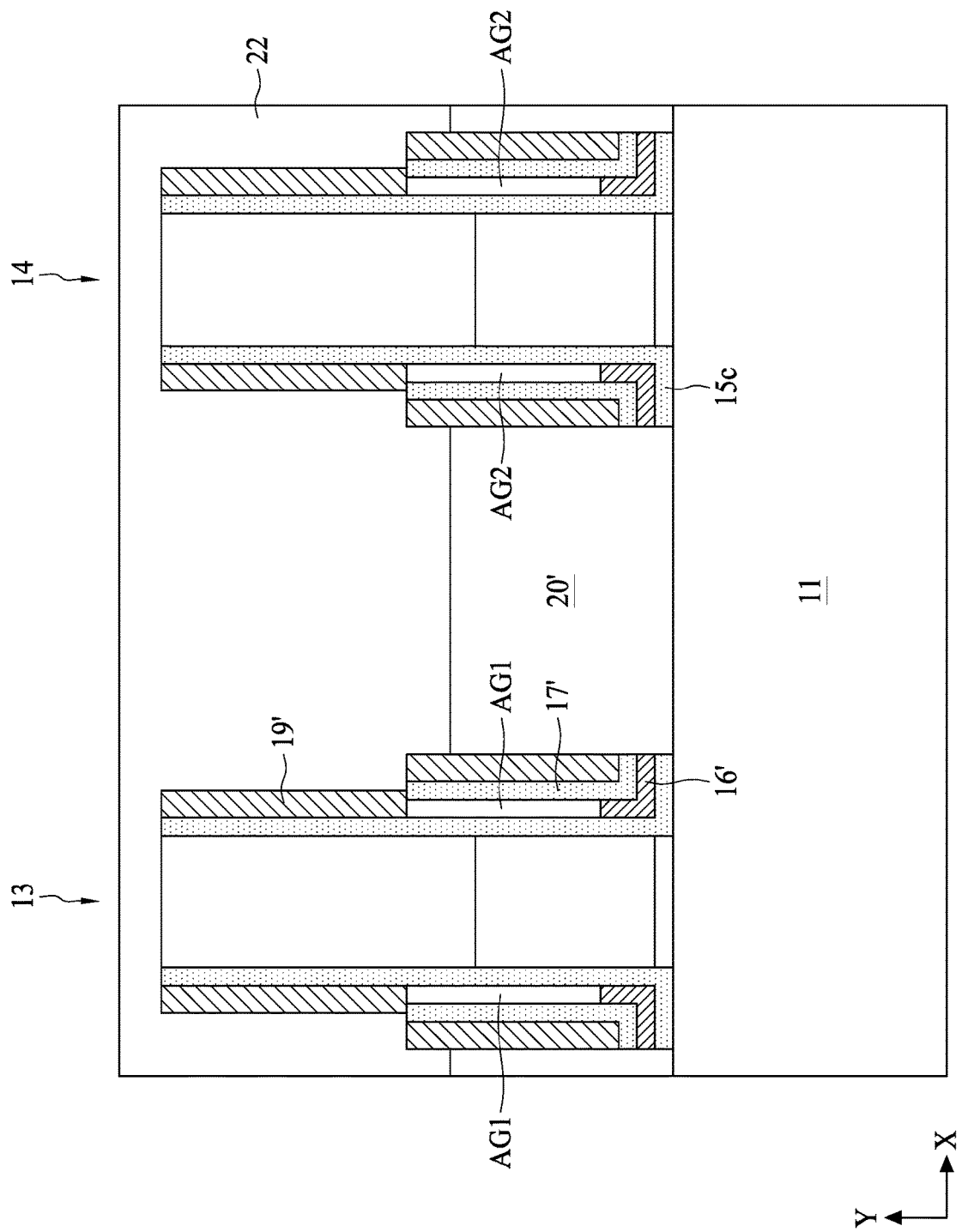

Referring to FIG. 16, in accordance with some embodiments of the present disclosure, after the operation S20, the method M1 further includes: (S21) forming a landing layer 22 over the contact 20', the first bit line 13 and the second bit line 14. In some embodiments, the landing layer 22 includes a metallic component. In some embodiments, the landing layer 22 includes copper. In some embodiments, a blanket deposition is performed to form the landing layer 22.

In some embodiments, the landing layer 22 covers the top of the first bit line 13 and the top of the second bit line 14.

In accordance with some embodiments of the present disclosure, prior to the formation of the landing layer 22, the method M1 further includes: forming an adhesion layer (not shown) over the contact 20', the first bit line 13 and the second bit line 14. In some embodiments, the adhesion layer is for a purpose of increasing adhesion between landing pads (to be formed later in the process) and the bit lines (e.g., the first bit line 13 and the second bit line 14) in order to prevent peeling off of the landing pads. In some embodiments, the adhesion layer is continuously and conformally disposed over the contact 20', the first spacer structure, the second spacer structure, the first bit line 13 and the second bit line 14. In some embodiments, the adhesion layer is patterned with a patterning operation to form the landing pads. In some embodiments, after the patterning operation, the adhesion layer is entirely overlapped by the landing pads.

Figure 17:
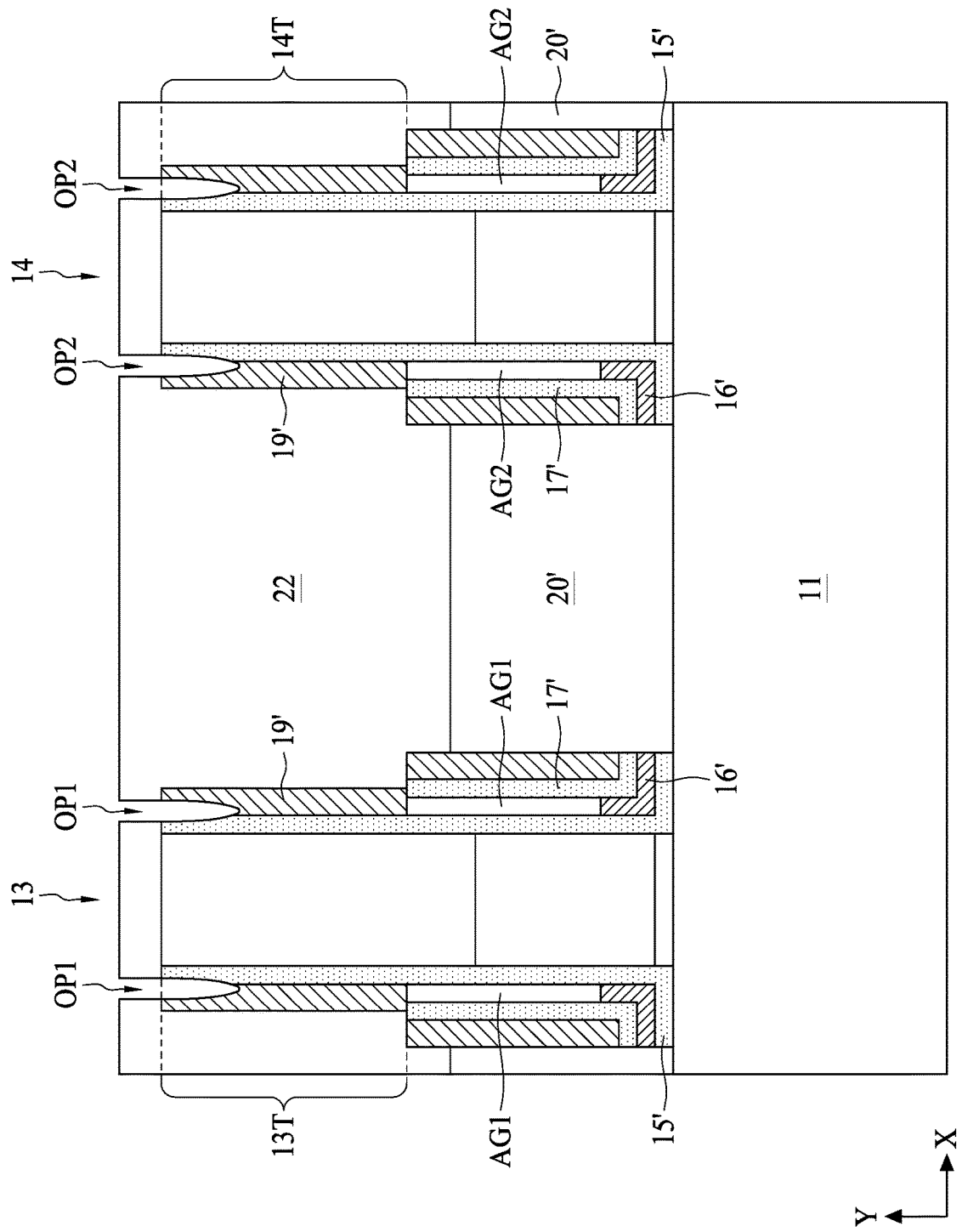
Figure 18:
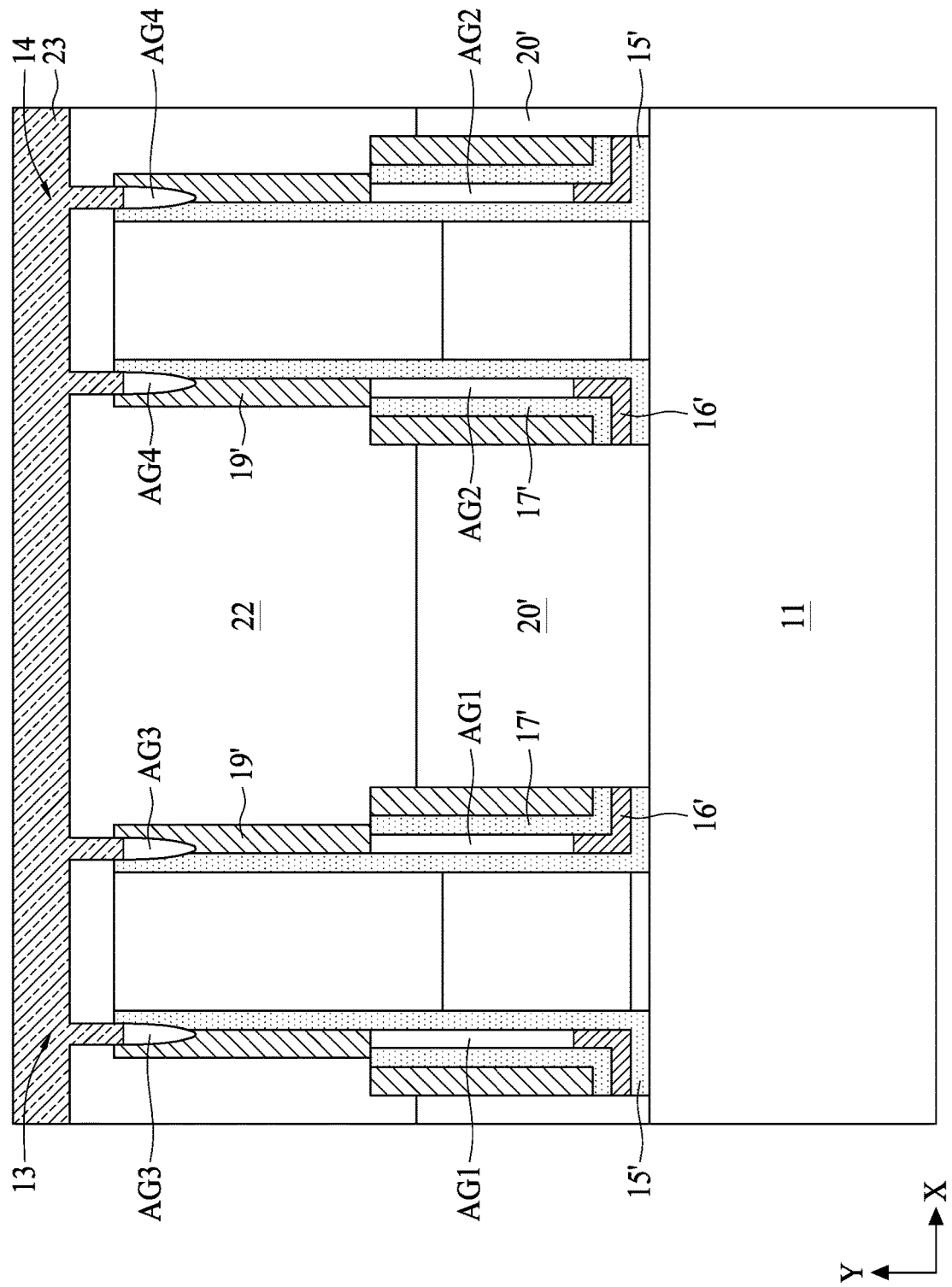
Figure 19:
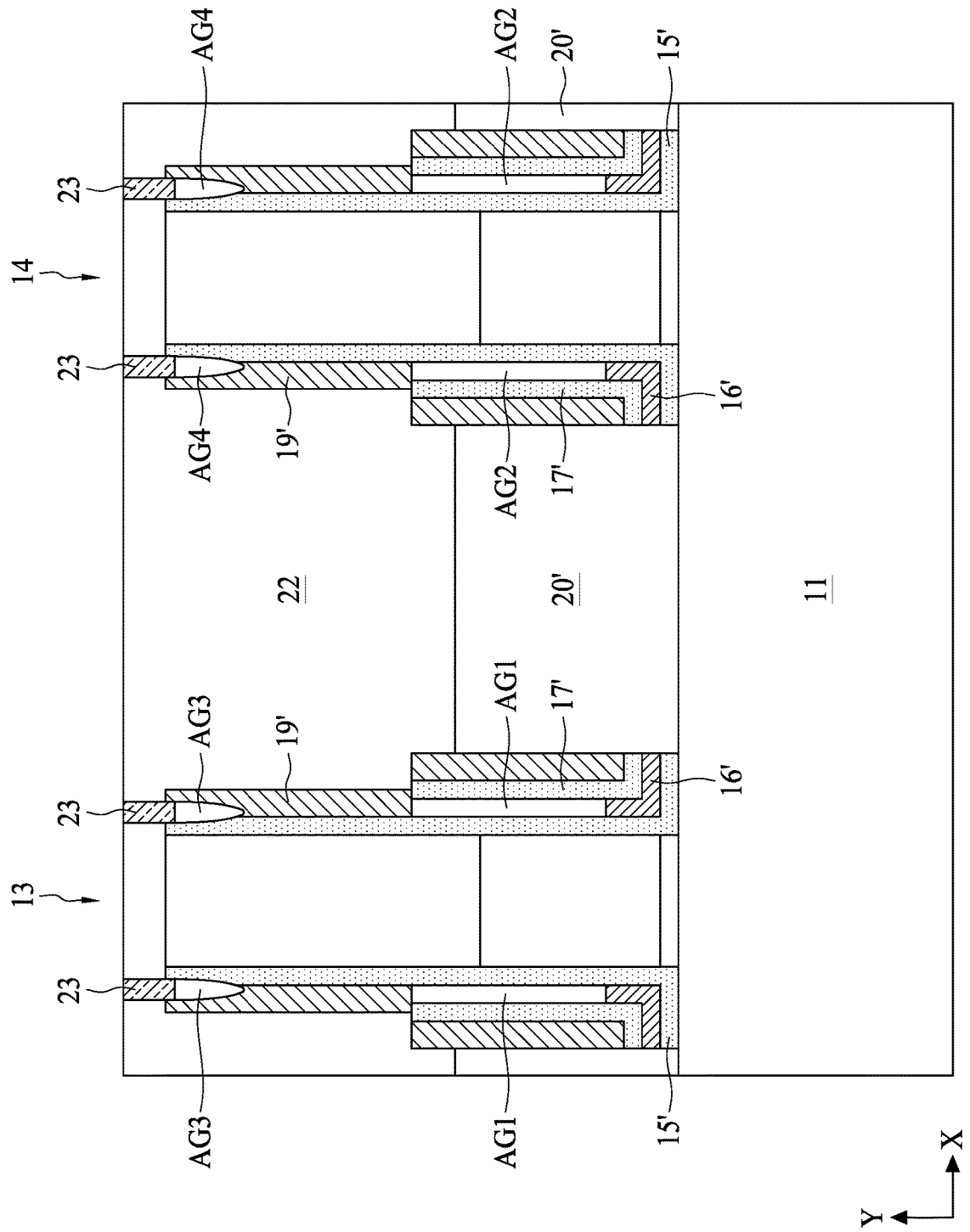

Referring to FIGS. 17 to 19, in accordance with some embodiments of the present disclosure, after the operation S21, the method M1 further includes: (S22) forming an upper air gap AG3 surrounding the first bit line 13 and an upper air gap AG4 surrounding the second bit line 14. In some embodiments, the operation S22 includes: (S221) forming openings in the spacer structures surrounding the first bit line 13 and the second bit line 14 respectively; (S222) sealing the openings to form the upper air gap AG3 and the upper air gap AG4; and (S223) exposing the landing layer 22.

Referring to FIG. 17, in accordance with some embodiments of the present disclosure and operation S221 of the operation S22 of the method M1, a first opening OP1 is formed surrounding the first bit line 13, and a second opening OP2 is formed surrounding the second bit line 14. In some embodiments, a directional dry etch is performed to form the first opening OP1 and the second opening OP2.

In some embodiments, a portion of the landing layer 22 covering a top of the first spacer structure is removed to form the first opening OP1. In such embodiments, a hole is formed penetrating the portion of the landing layer 22 over the top of the first spacer structure, and the first spacer structure is exposed. In some embodiments, a portion of the first spacer layer 15' and/or a portion of the third spacer layer 19' is removed. In some embodiments, the first opening OP1 surrounds the first bit line 13 from a top view perspective (not shown). In some embodiments, a portion of the first opening OP1 is disposed between the first spacer layer 15' and the third spacer layer 19' and surrounds an upper portion 13T of the first bit line 13, in which the upper portion 13T is defined as a portion of the first bit line 13 above the air gap AG1. In some embodiments, the first opening OP1 is separated from the air gap AG1 by the first spacer layer 15' and/or the third spacer layer 19'. In some embodiments, the first opening OP1 contacts the top of the air gap AG1 (not shown).

In some embodiments, a portion of the landing layer 22 covering a top of the second spacer structure is removed to form the second opening OP2. In such embodiments, a hole is formed penetrating the portion of the landing layer 22 over the top of the second spacer structure, and the second spacer structure is exposed. In some embodiments, a portion of the first spacer layer 15' and/or a portion of the third spacer layer 19' is removed. In some embodiments, the second opening OP2 surrounds the second bit line 14 from a top view perspective (not shown). In some embodiments, a portion of the second opening OP2 is disposed between the first spacer layer 15' and the third spacer layer 19' and surrounds an upper portion 14T of the second bit line 14, in which the upper portion 14T is defined as a portion of the second bit line 14 above the air gap AG2. In some embodiments, the second opening OP2 is separated from the air gap AG2 by the second spacer structure. In some embodiments, the second opening OP2 contacts the top of the air gap AG2.

Referring to FIG. 18, in accordance with some embodiments of the present disclosure and operation S222 of the operation S22 of the method M1, a dielectric layer 23 is formed over the landing layer 22. In some embodiments, the dielectric layer 23 is formed by a deposition of nitride layer. The dielectric layer 23 fills a portion of the first opening OP1 and a portion of the second opening OP2 to form the air gap AG3 and the air gap AG4. In some embodiments, the air gap AG3 surrounds the upper portion 13T of the first bit line 13, and the air gap AG4 surrounds the upper portion 14T of the second bit line 14. In some embodiments, the air gap AG3 extends from the top of the first spacer structure toward the air gap AG1, and the air gap AG4 extends from the top of the second spacer structure toward the air gap AG2. In some embodiments, the dielectric layer 23 is in physical contact with the first spacer structure and/or the second spacer structure. More specifically, in such embodiments, the dielectric layer 23 is in physical contact with the first spacer layer 15' and/or the third spacer layer 19'. Therefore, in such embodiments, a top of the air gap AG3 is lower than the top of the first bit line 13, and/or a top of the air gap AG4 is lower than the top of the second bit line 14. In some embodiments, the dielectric layer 23 is separated from the first spacer structure and/or the second spacer structure. More specifically, in such embodiments, the dielectric layer 23 is separated from the first spacer layer 15' and the third spacer layer 19' surrounding the first bit line 13 and/or surrounding the second bit line 14. Therefore, in such embodiments, the top of the air gap AG3 is higher than the top of the first bit line 13, and/or the top of the air gap AG4 is higher than the top of the second bit line 14. In some embodiments, a dimension of the air gap AG3 is less than a dimension of the air gap AG1. In some embodiments, a dimension of the air gap AG4 is less than a dimension of the air gap AG2. In some embodiments, a width of the air gap AG3 is less than a width of the air gap AG1. In some embodiments, a width of the air gap AG4 is less than a width of the air gap AG2. In some embodiments, a length of the air gap AG3 is less than the height H1 of the air gap AG1. In some embodiments, a length of the air gap AG4 is less than the height H2 of the air gap AG2.

Referring to FIG. 19, in accordance with some embodiments of the present disclosure, and the step S223 of the operation S22 of the method M1, a portion of the dielectric layer 23 is removed to expose the landing layer 22. In some embodiments, a planarization is performed to remove the portion of the dielectric layer 23. In some embodiments, the planarization stops upon an exposure of the landing layer 22. In some embodiments, at least a portion of the dielectric layer 23 remains in the first opening OP1 and the second opening OP2 to keep the air gap AG3 and the air gap AG4 sealed.

Figure 20:
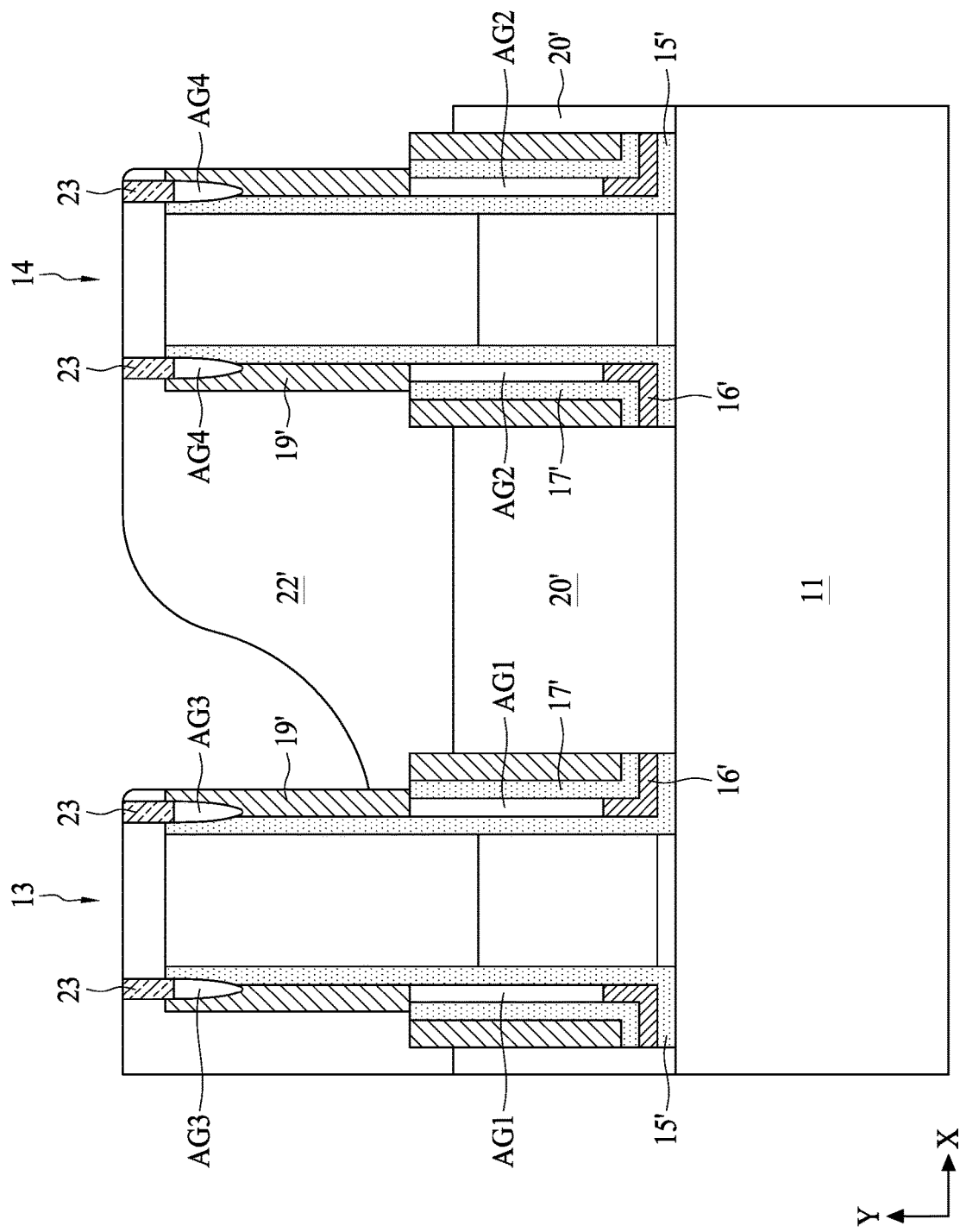

Referring to FIG. 20, in accordance with some embodiments of the present disclosure, after the step S223 of the operation S22, the method M1 further includes: (S23) forming a landing pad 22'. In some embodiments, a patterning operation is performed to remove portions of the landing layer 22, thereby forming one or more landing pads 22'. For ease of illustration, only the landing pad 22' electrically connected to the contact 20' between the first bit line 13 and the second bit line 14 is described in the following description. In some embodiments, the landing pad 22' is conformal to the contact 20' and an adjacent bit line (e.g., the second bit line 14). In some embodiments, the adhesion layer (not shown) is patterned concurrently with the landing layer 22. In some embodiments, the adhesion layer is disposed conformally between the landing pad 22' and the contact 20', and between the landing pad 22' and the second bit line 14. In some embodiments, the landing pad 22' has rounded corners due to the etching operation.

In accordance with some embodiments of the present disclosure, the operation S23 is performed prior to the operation S22. In some embodiments, the air gaps AG3 and AG4 are formed in different positions of the first spacer structure and the second spacer structure due to different sequences of the performing of the operations S22 and S23. In some embodiments, the landing pad 22' and the dielectric layer 23 have configurations different from those embodiments of the semiconductor structure 2 shown in FIG. 20.

Figure 21:
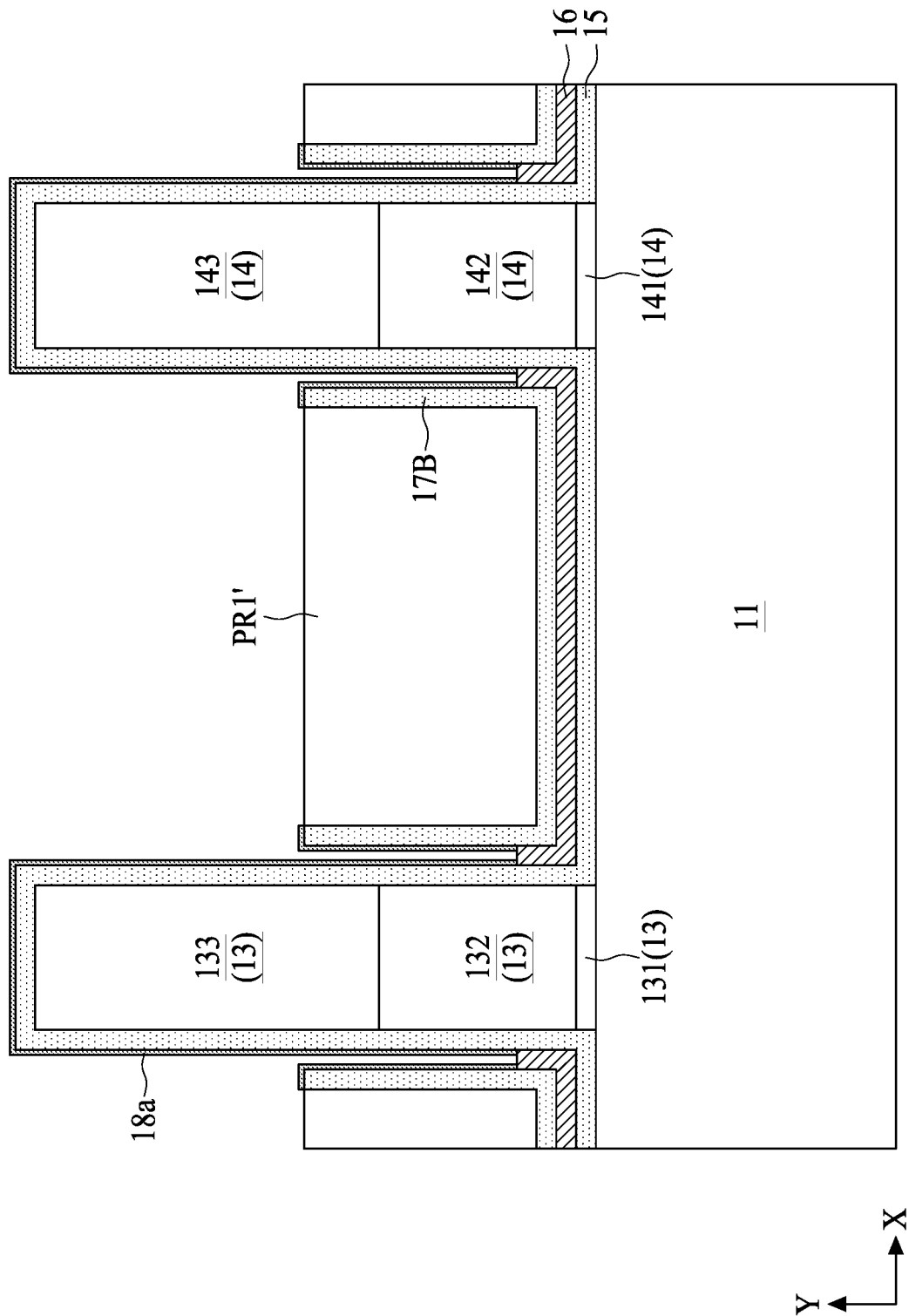
FIGS. 21 to 23 illustrate cross-sectional views of intermediate stages in the formation of a semiconductor structure in accordance with some embodiments of the present disclosure.
Figure 22:
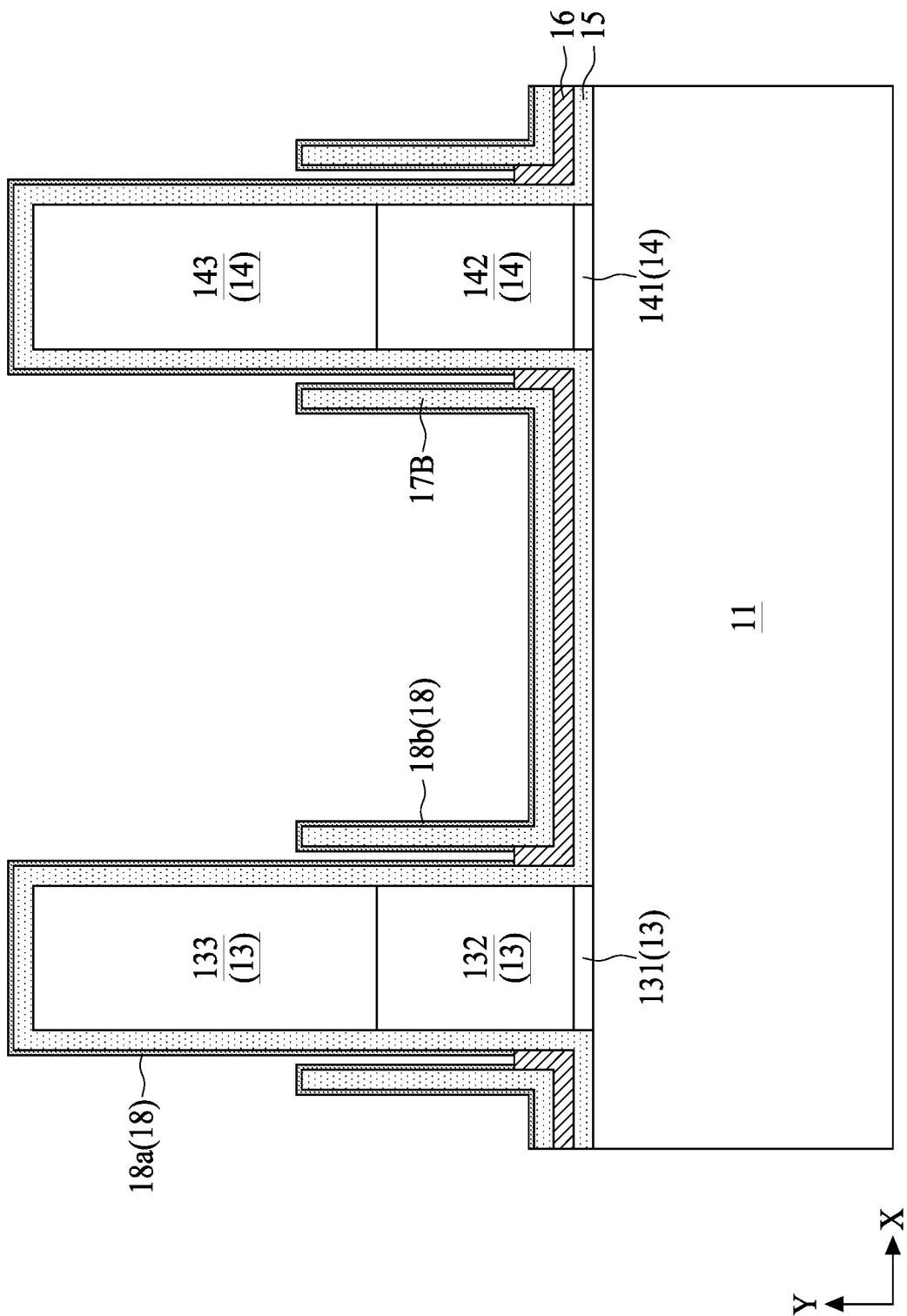
Figure 23:
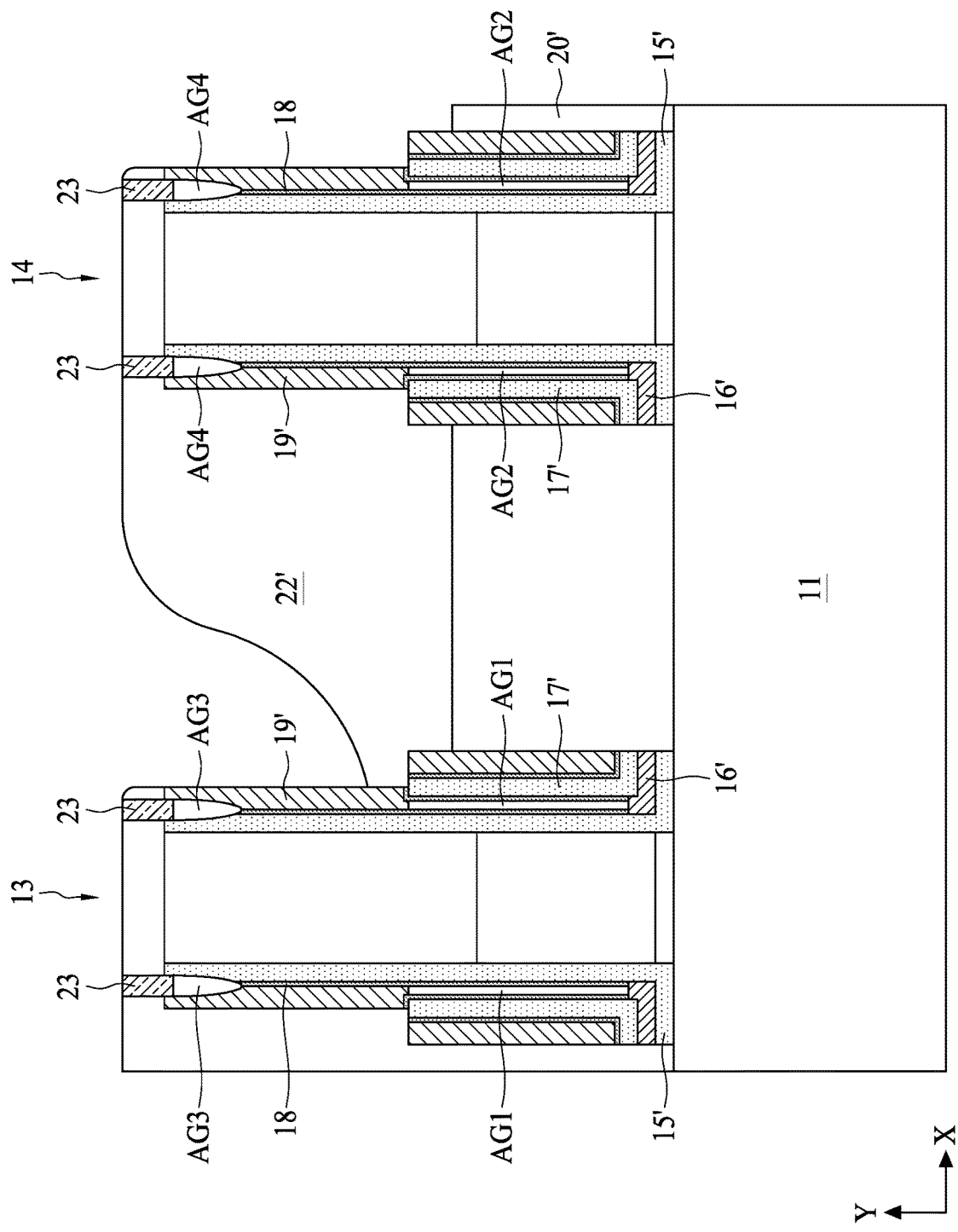

FIGS. 21 to 23 are schematic cross-sectional views of a semiconductor structure 3 at different manufacturing stages according to the method M1. As described above, in some embodiments, a native dielectric layer is formed conformal to the first spacer layer 15 and the second spacer layer 17B. In accordance with some embodiments of the present disclosure, after the operation S16, a dielectric layer 18a is formed over exposed surfaces of the first spacer layer 15 and the second spacer layer 17B. In accordance with some embodiments of the present disclosure, after the removal of the photoresist PR1', a dielectric layer 18b is formed over exposed surfaces of the second spacer layer 17B. In some embodiments, the native dielectric layer 18b is formed over the surface of the second spacer layer 17B that was in contact with the photoresist PR1'. In some embodiments, the dielectric layer 18a and the dielectric layer 18b together are defined as a dielectric layer 18. In some embodiments, the dielectric layer 18 is formed conformally to a profile of the exposed surfaces of the first spacer layer 15 and the second spacer layer 17B. In some embodiments, the dielectric layer 18 is disposed between the first spacer layer 15 and the second spacer layer 17B where the removed portion of the sacrificial layer SA1 had been disposed. In some embodiments, the dielectric layer 18 is naturally formed when the first spacer layer 15 and the second spacer layer 17B expose to ambient environment. In some embodiments, the dielectric layer 18 is a native oxide layer. The method M1 as described above is performed on the intermediate structure of FIG. 22 to form the semiconductor structure 3 as shown in FIG. 23. Detailed description is not repeated herein.

Figure 24:
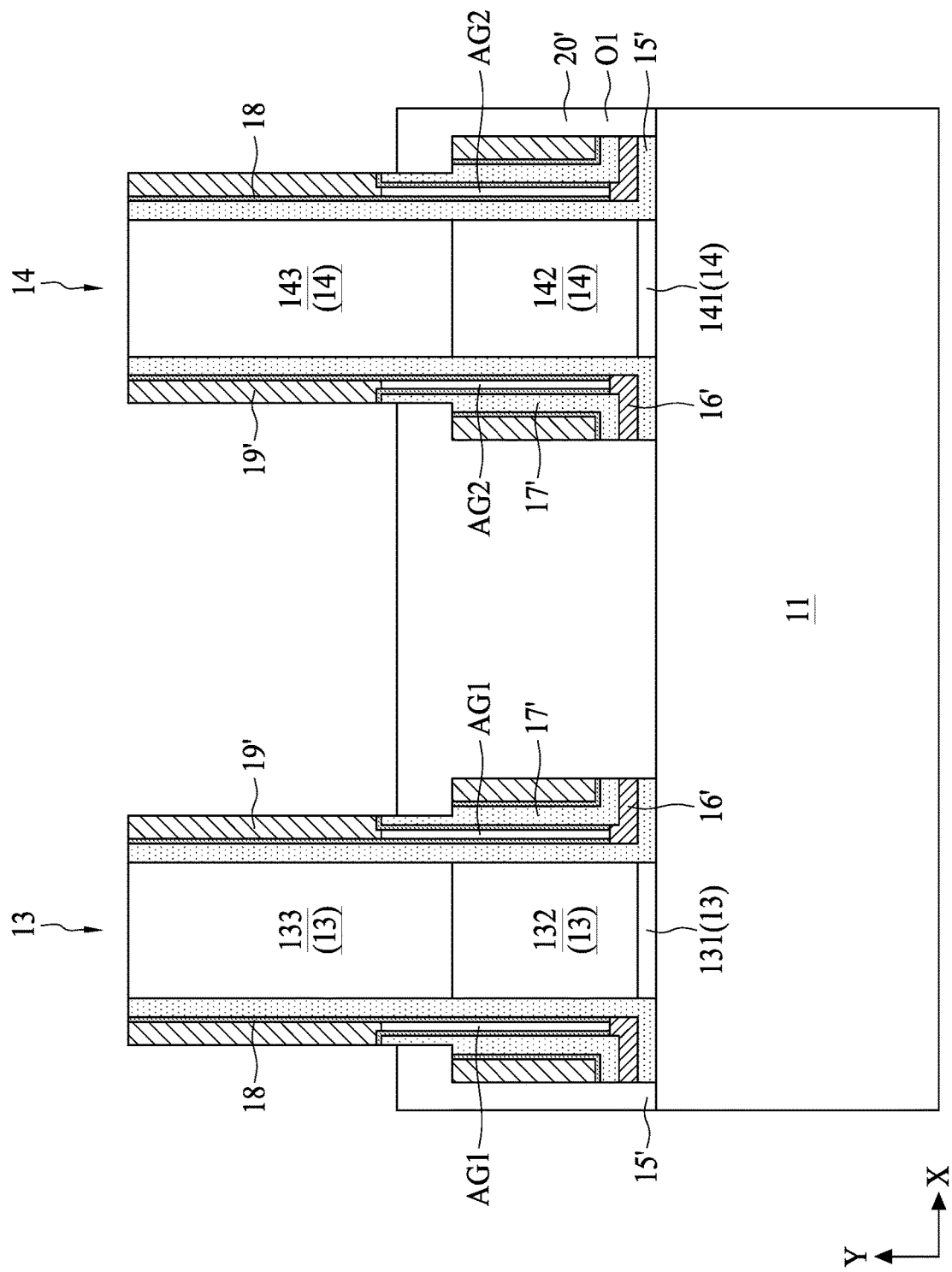
FIGS. 24 to 25 illustrate cross-sectional views of intermediate stages in the formation of a semiconductor structure in accordance with some embodiments of the present disclosure.
Figure 25:
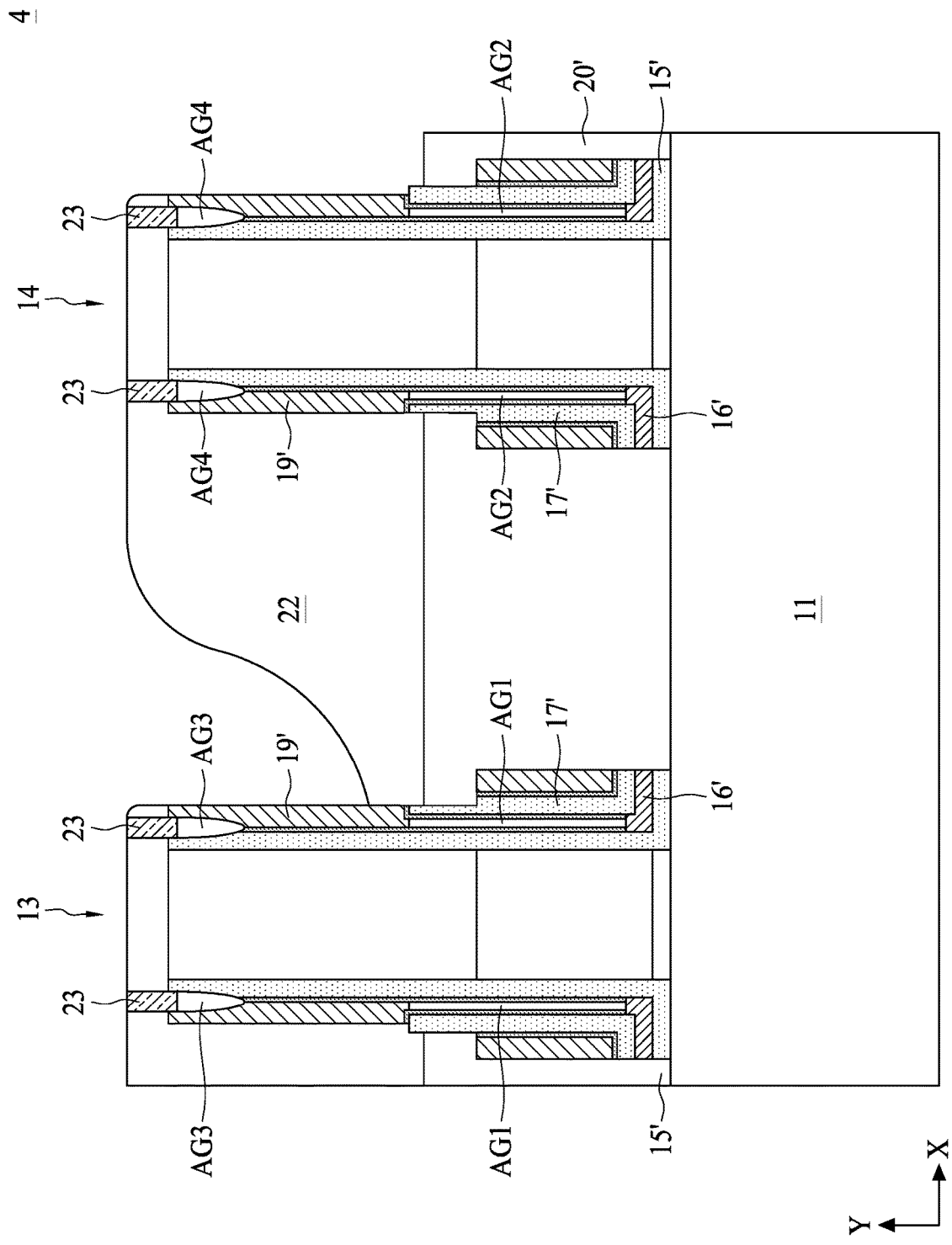

FIGS. 24 to 25 are schematic cross-sectional views of a semiconductor structure 4 at different manufacturing stages according to the method M1. As described above, in some embodiments, a top portion of the second spacer layer 17' exposed through the third spacer layer 19' is also removed during the operation S19. In some embodiments, a single directional dry etch is performed in the operation S19. In some embodiments, the single directional dry etch stops upon an exposure of the substrate 11. Alternative to the intermediate structure of FIG. 13, the top portion of the second spacer layer 17', a top portion of the lower portion 193B, and a top portion of the lower portion 194B exposed through the upper portions 193T and 194T are concurrently removed by the directional dry etch. In some embodiments, a top of the lower portion 193B and/or a top of the lower portion 194B are lower than the top of the second spacer layer 17'. In some embodiments, the second spacer layer 17' has a stepped configuration as shown in FIG. 23. Following the method M1 as described above, a contact 20' having a T-shaped configuration is formed between the first bit line 13 and the second bit line 14 after the operation S20 as shown in FIG. 24. After the operation 20, other operations of the method M1 are sequentially performed on the intermediate structure of FIG. 24 to form the semiconductor structure 4 as shown in FIG. 25. Detailed description is not repeated herein.

Figure 26:
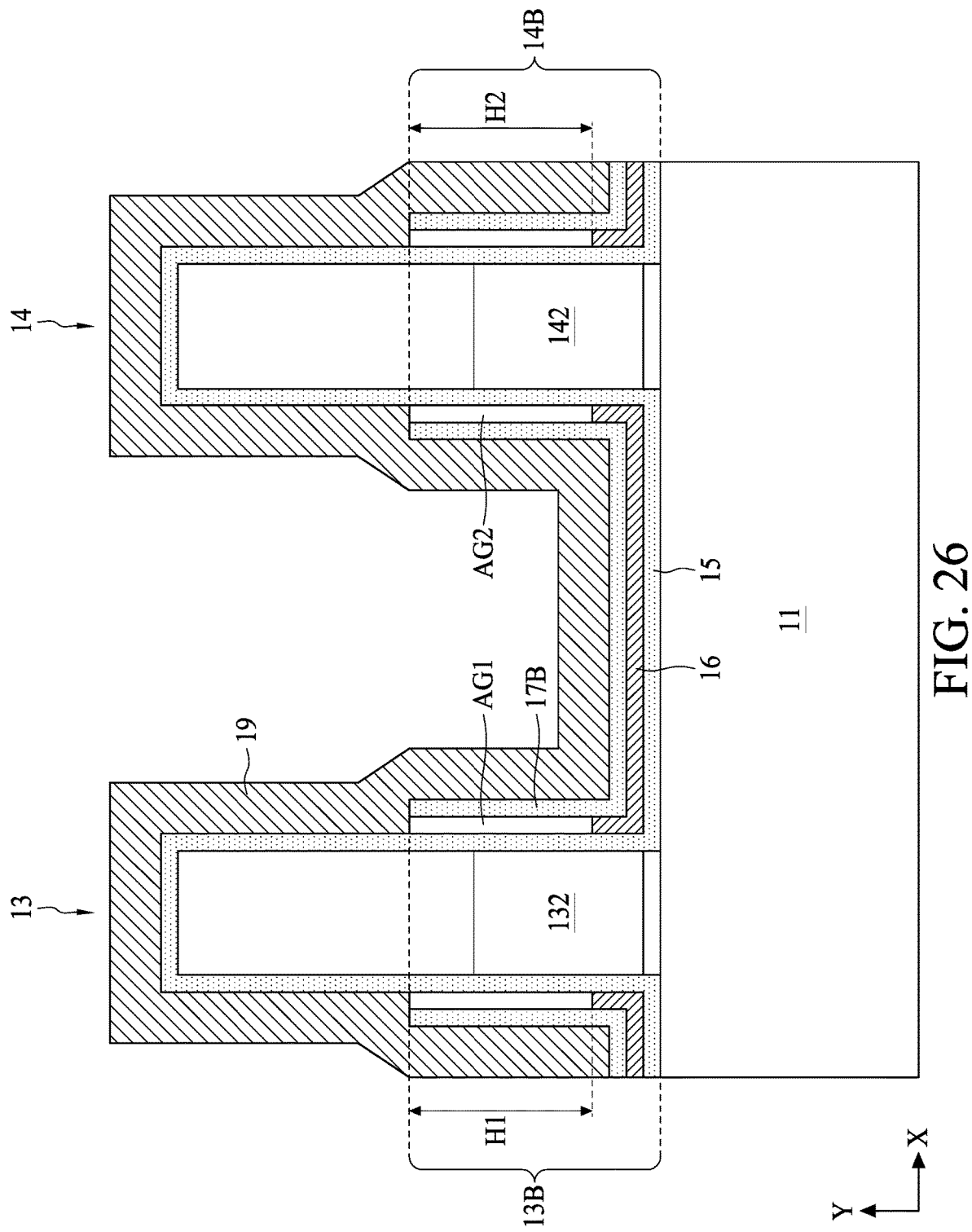
FIGS. 26 to 28 illustrate cross-sectional views of intermediate stages in the formation of a semiconductor structure in accordance with some embodiments of the present disclosure.
Figure 27:
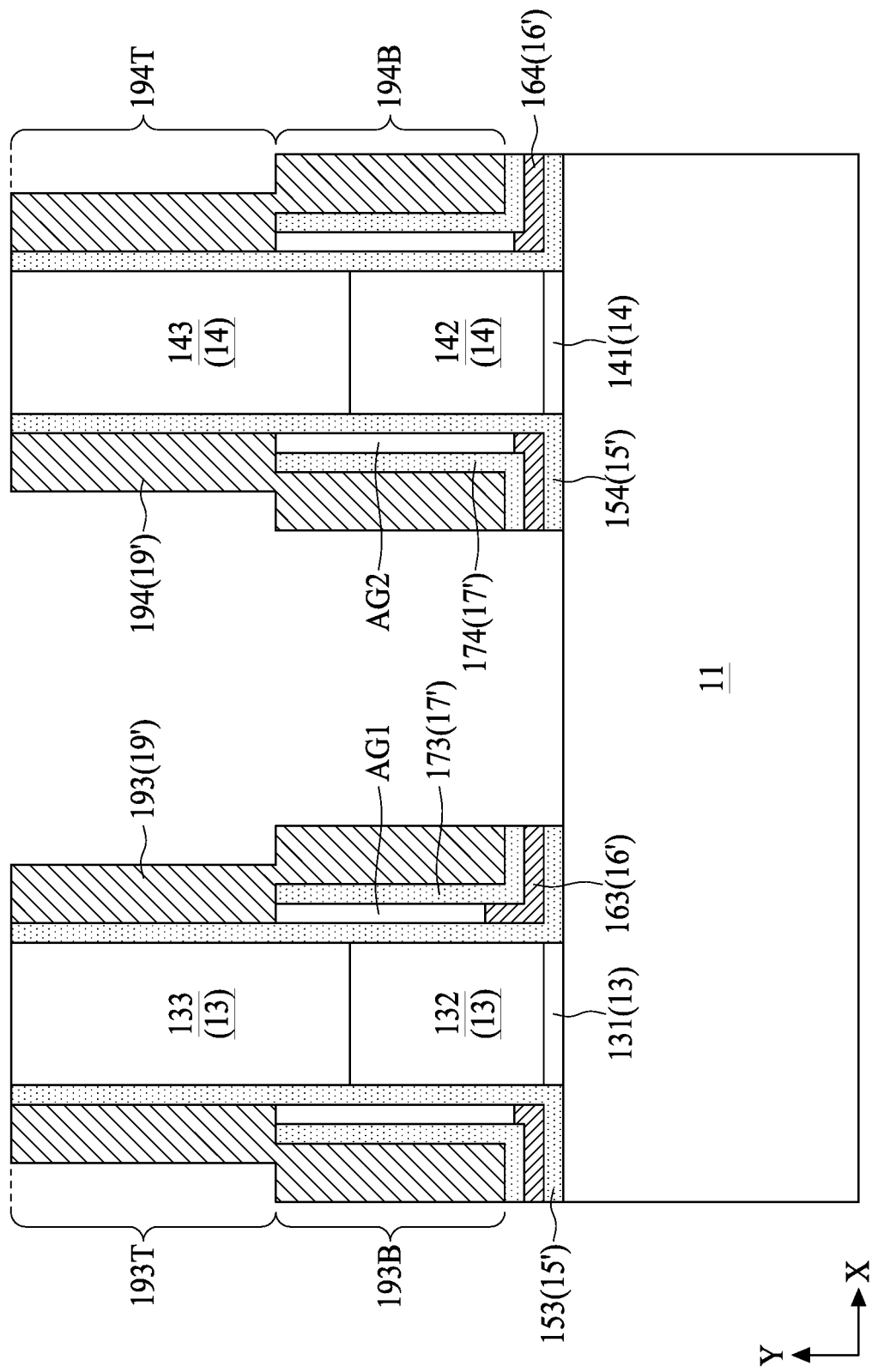
Figure 28:
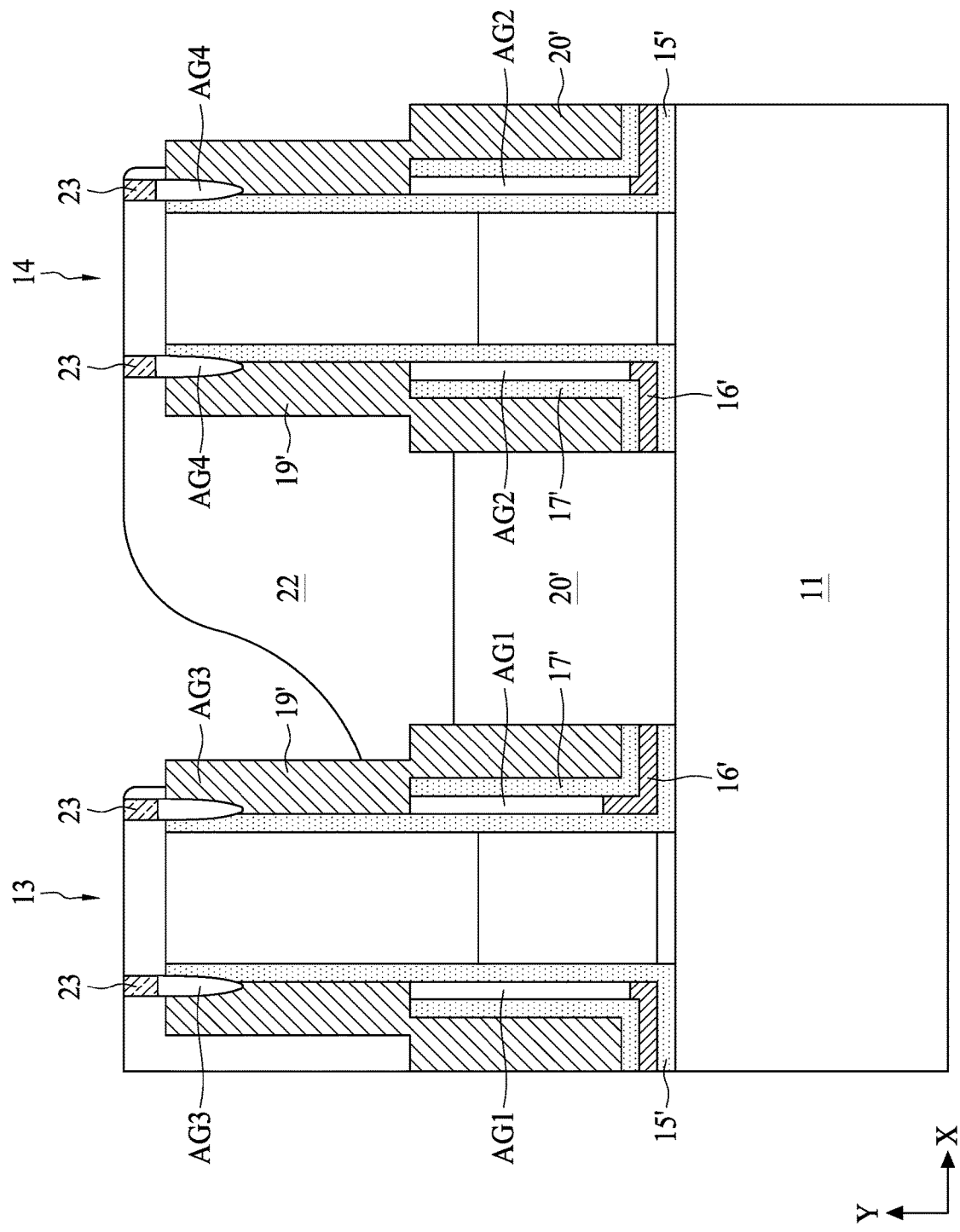

FIGS. 26 to 28 are schematic cross-sectional views of a semiconductor structure 5 at different manufacturing stages according to the method M1. Referring to FIG. 26, in some embodiments, the thickness of the third spacer layer 19 is greater than or equal to a total thickness of the dielectric layer 16 and the second spacer layer 17B. In such embodiments, the top of the second spacer layer 17B can be fully covered by a vertical portion of the third spacer layer 19. The entire vertical portion of the second spacer layer 17B is protected by the vertical portion of the third spacer layer 19 during the operation S19. Referring to FIG. 27, in such embodiments, a portion of the lower portion 193B is protected by the upper portion 193T. In such embodiments, a portion of the lower portion 194B is protected by the upper portion 194T. Therefore, as shown in FIG. 26, the first partial layer 193 is a continuous and stepped layer, in which the upper portion 193T and the lower portion 193B are connected. The second partial layer 194 is a continuous and stepped layer, and the upper portion 194T and the lower portion 194B are connected. The method M1 as described above is performed on the intermediate structure of FIG. 27 to form the semiconductor structure 5 as shown in FIG. 28. As described above in illustration of manufacturing the semiconductor structure 2, in some embodiments, the dielectric layer 23 seals the air gaps AG3 and AG4 and is separated from the first spacer layer 15' and/or the third spacer layer 19'. In such embodiments, a top of the air gap AG3 is over a top of the first bit line 13 and/or a top of the air gap AG4 is over a top of the second bit line 14. Other elements of the semiconductor structure 5 are similar to those of the semiconductor structure 2, and detailed description is not repeated herein.

FIGS. 29 to 32 are schematic cross-sectional views of a semiconductor structure 6 at different manufacturing stages according to the method M1, with the operation S23 performed prior to the operation S22. As described above, in some embodiments, the operation S23 is performed prior to the operation S22 to provide different configurations of the landing pad 22' and the dielectric layer 23.

Figure 29:
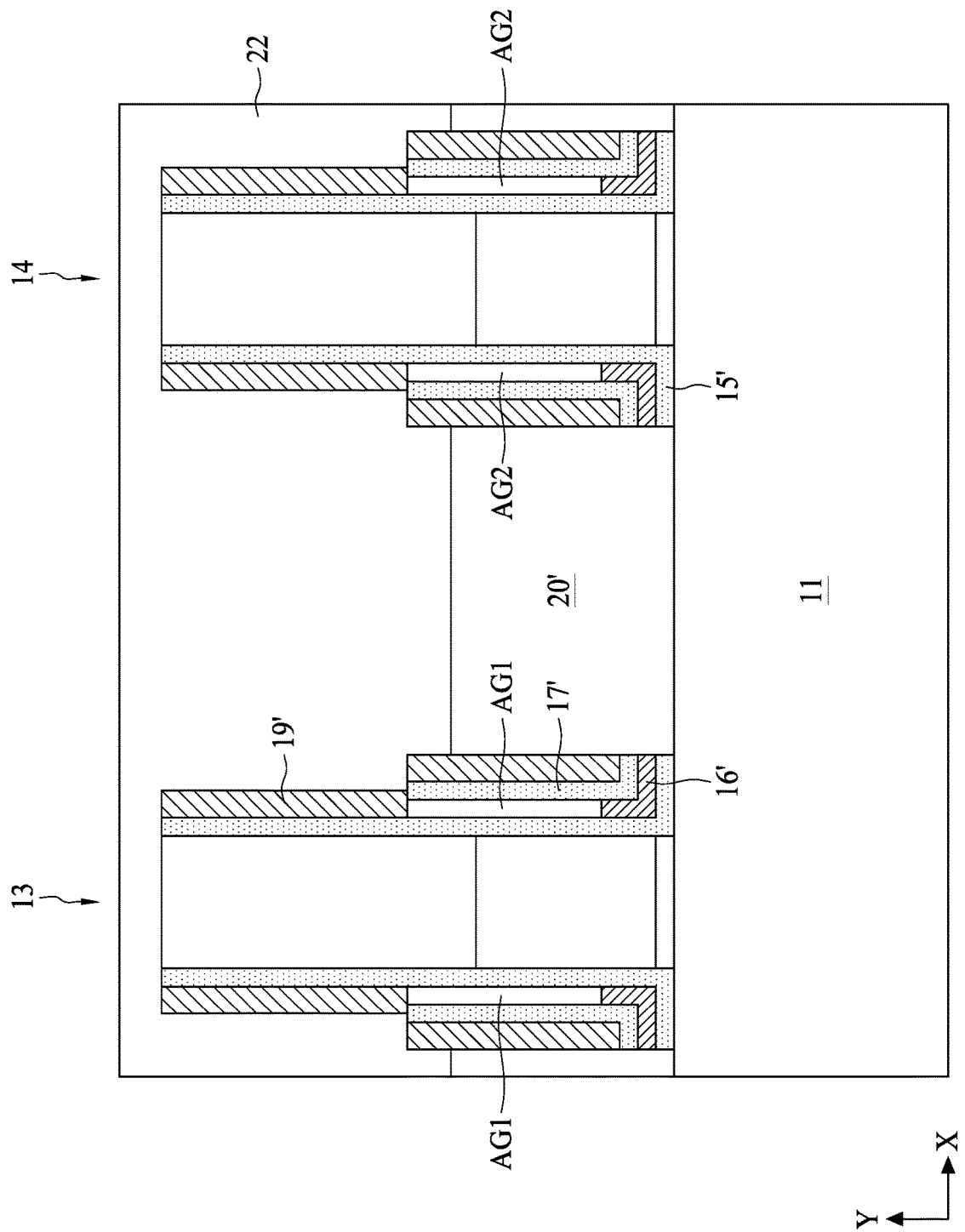
FIGS. 29 to 32 illustrate cross-sectional views of intermediate stages in the formation of a semiconductor structure in accordance with some embodiments of the present disclosure.

Referring to FIG. 29, in accordance with some embodiments of the present disclosure, an intermediate structure is formed according to the operations S11 to S21 as described above. In some embodiments, the operation S23 is performed on the intermediate structure of FIG. 29.

Figure 30:
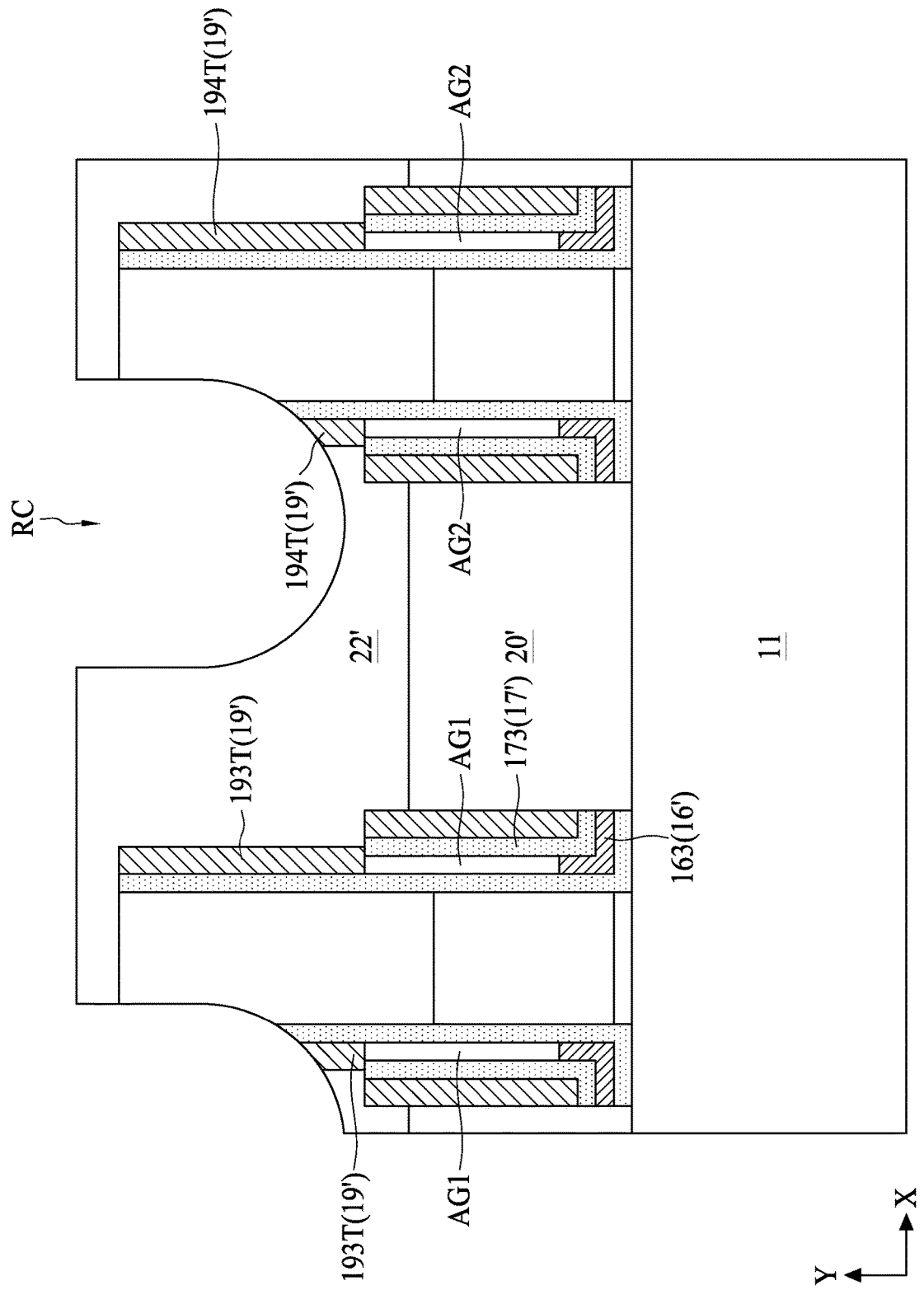

Referring to FIG. 30, in accordance with some embodiments of the present disclosure, the operation S23 is performed to form the landing pad 22'. In some embodiments, the landing layer 22 is patterned to form the landing pads 22'. In some embodiments, an etching operation is performed on the landing layer 22 to form the landing pads 22'. In some embodiments, portions of the landing layer 22 are removed by the etching operation. In some embodiments, a plurality of recesses RC are formed between the landing pads 22'. For ease of illustration, only the landing pad 22' electrically connected to the contact 20' between the first bit line 13 and the second bit line 14, and only the recess RC disposed between the first bit line 13 and the second bit line 14, are described in the following description. In some embodiments, the first partial layer 153 of the first spacer layer 15' and the upper portion 193T of the first partial layer 193 are exposed. In some embodiments, a portion of the first spacer structure surrounding a portion of the upper portion 13T of the first bit line 13 is also removed by the etching operation. In some embodiments, the second partial layer 154 of the first spacer layer 15' and the upper portion 194T of the second partial layer 194 are exposed. In some embodiments, a portion of the second spacer structure surrounding a portion of the upper portion 14T of the second bit line 14 is also removed by the etching operation. In some embodiments, a portion of the upper portion 13T of the first bit line 13 is further removed by the etching operation. In some embodiments, a portion of the upper portion 14T of the second bit line 14 is further removed by the etching operation. In some embodiments, a patterned mask is formed over at least a portion of the first bit line 13 and at least a portion of the first spacer structure prior to the etching operation. In some embodiments, a patterned mask is formed over at least a portion of the second bit line 14 and at least a portion of the second spacer structure prior to the etching operation. In some embodiments, a directional dry etching is performed to form the landing pad 22'.

Figure 31:
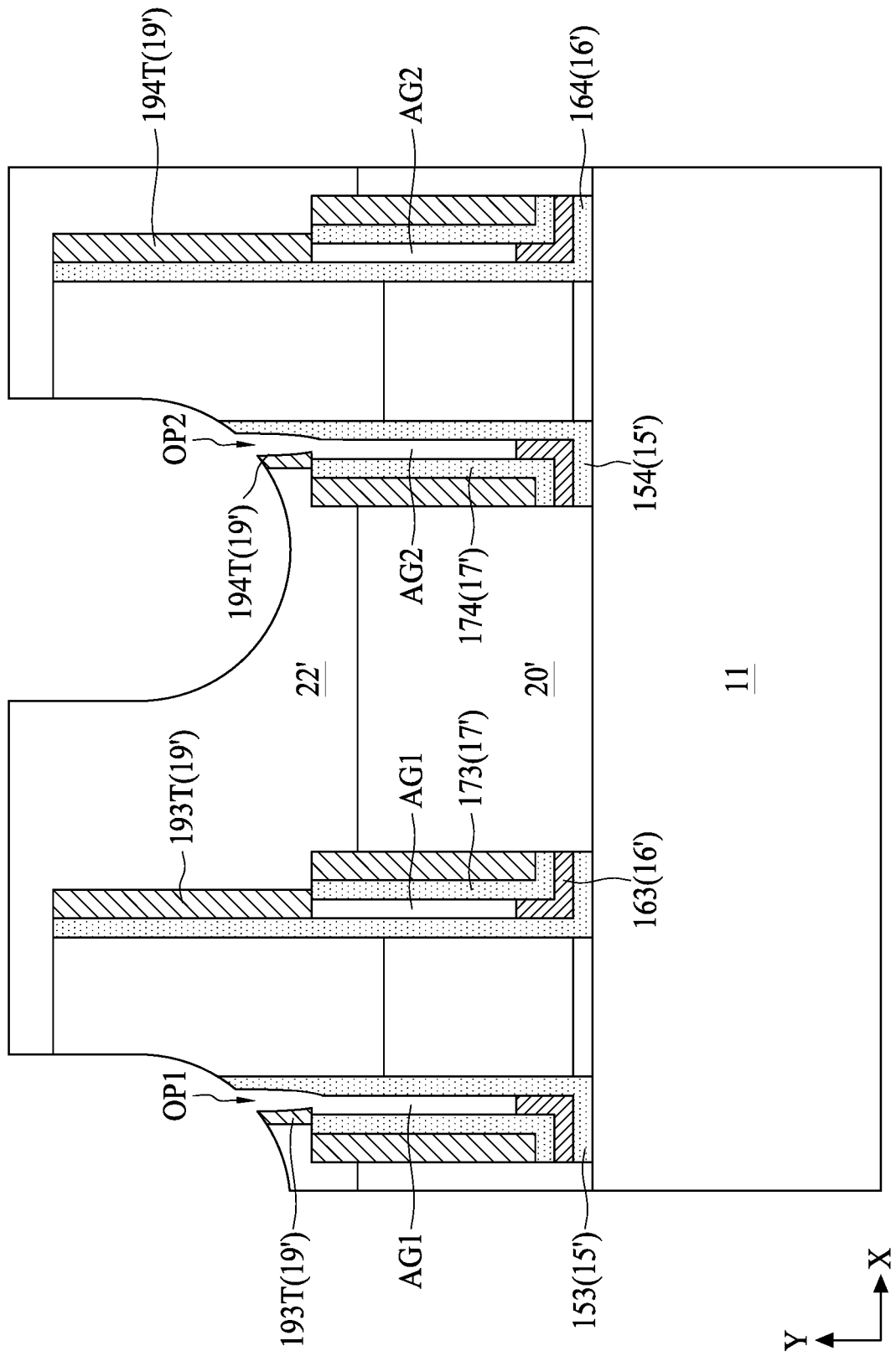
Figure 32:
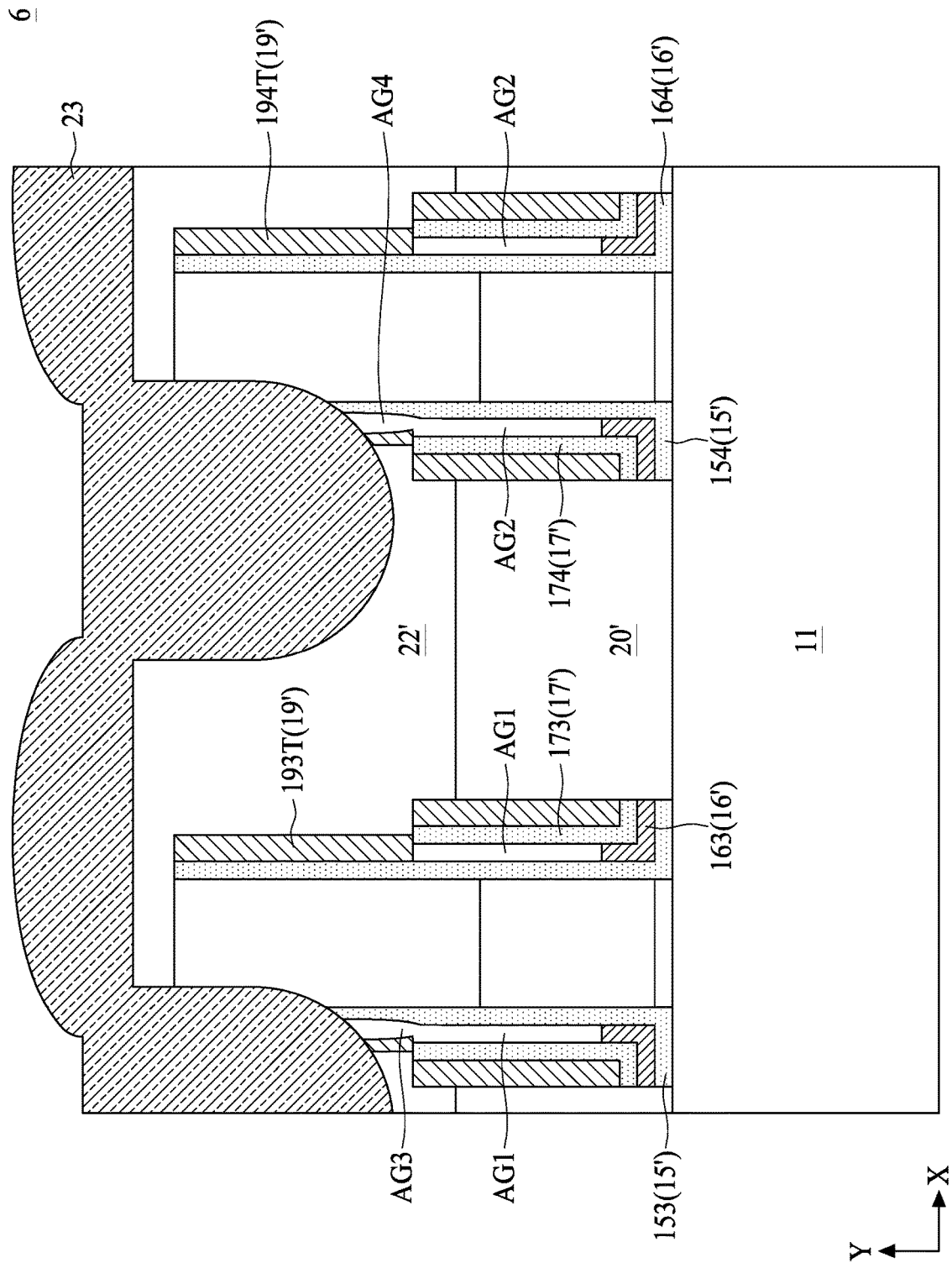

Referring to FIGS. 31 to 32, in accordance with some embodiments of the present disclosure, the operation S22 is performed after the operation S23 on the intermediate structure of FIG. 28. A first opening OP1 is formed adjacent to the first bit line 13, and a second opening OP2 is formed adjacent to the second bit line 14. In some embodiments, a directional dry etch is performed to form the first opening OP1 and the second opening OP2.

Referring to FIG. 30, in accordance with some embodiments of the present disclosure, the first opening OP1 and the second opening OP2 are formed. In some embodiments, a portion of the first partial layer 153 of the first spacer layer 15' and the upper portion 193T of the third spacer layer 19' are removed. In some embodiments, the first opening OP1 is disposed adjacent to the upper portion 13T of the first bit line 13, and extends from a midpoint between a bottom and a top of the upper portion 13T of the first bit line 13. In some embodiments, the second opening OP2 is disposed adjacent to the upper portion 14T of the second bit line 14, and extends from a midpoint between a bottom and a top of the upper portion 14T of the second bit line 14. In some embodiments, a portion of the first opening OP1 is disposed between the first partial layer 153 of the first spacer layer 15' and the upper portion 193T of the third spacer layer 19'. In some embodiments, the first opening OP1 is connected to the top of the air gap AG1. In some embodiments, a portion of the second opening OP2 is disposed between the second partial layer 154 of the first spacer layer 15' and the upper portion 194T of the third spacer layer 19'. In some embodiments, the second opening OP2 is connected to the top of the air gap AG2.

Referring to FIG. 31, in accordance with some embodiments of the present disclosure, the operation 22 is performed on the intermediate structure of FIG. 30 to from the semiconductor structure 6. In some embodiments, a dielectric layer 23 is formed over the landing pad 22' of FIG. 30. In some embodiments, the dielectric layer 23 is formed over the landing pad 22', the first bit line 13 and the second bit line 14. In some embodiments, the dielectric layer 23 fills the recesses and is disposed on the top of the first bit line 13 and the top of the second bit line 14. In some embodiments, portions of the dielectric layer 23 in the recess RC seal the air gap AG3 and the air gap AG4. In some embodiments, a blanket deposition is performed to form the dielectric layer 23, and a top surface of the dielectric layer 23 is not a planar surface. In some embodiments, a profile of the top surface of the dielectric layer 23 corresponds to a profile of the landing pad 22', the first bit line 13 and the second bit line 14 after the operation S23.

One aspect of the present disclosure provides a semiconductor structure. The semiconductor structure includes: a substrate; a bit line structure disposed over the substrate; a first dielectric layer, surrounding the bit line structure; a second dielectric layer, surrounding a lower portion of the first dielectric layer, wherein the second dielectric layer is separated from the first dielectric layer by a first air gap; and a third dielectric layer, surrounding an upper portion of the first dielectric layer and sealing the first air gap.

Another aspect of the present disclosure provides a semiconductor structure. The semiconductor structure includes: a first bit line and a first spacer structure. The first bit line is disposed over a substrate. The first spacer structure surrounds the first bit line and includes a first dielectric layer and a first air gap sealed by the first dielectric layer. The first air gap surrounds a lower portion of the first bit line.

Another aspect of the present disclosure provides a method for manufacturing a semiconductor structure. The method includes: forming a bit line over a substrate; forming a first spacer layer over and conformal to the bit line; forming a sacrificial layer over and conformal to the first spacer layer; forming a second spacer layer over and conformal to the sacrificial layer; forming a mask layer covering a lower portion of the second spacer layer; removing an upper portion of the second spacer layer; removing the sacrificial layer; and forming a third spacer layer over the first spacer layer and the second spacer layer, thereby forming a first air gap surrounded by the lower portion of the second spacer layer.

In conclusion, the application discloses a semiconductor structure, and a method for forming the semiconductor structure. The semiconductor structure includes an air gap surrounding a lower portion of the bit line, and a parasitic effect between the metal layer of the bit line and the contact can be minimized. The semiconductor structure may further include an air gap surrounding an upper portion of the bit line, and a parasitic effect between the landing pad and the bit line can be also minimized.

Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, composition of matter, means, methods and steps described in the specification. As one of ordinary skill in the art will readily appreciate from the present disclosure, processes, machines, manufacture, compositions of matter, means, methods or steps, presently existing or later to be developed, that perform substantially the same function or achieve substantially the same result as the corresponding embodiments described herein, may be utilized according to the present disclosure. Accordingly, the appended claims are intended to include within their scope such processes, machines, manufacture, compositions of matter, means, methods and steps.

What is claimed is:

1. A semiconductor structure, comprising:
   a substrate;
   a bit line structure disposed over the substrate;
   a spacer structure which comprises:
   a first spacer layer surrounding the bit line structure;
   a second spacer layer surrounding a lower portion of the bit line structure and the first spacer layer to define a first air gap between the first spacer layer and the second spacer layer; and
   a third spacer layer being divided into a lower portion surrounding the air gap and an upper portion above the air gap; and
   a first dielectric layer surrounding the bit line structure and positioning between the first spacer layer and the second spacer layer, wherein the first air gap is concealed by the first spacer layer, the second spacer layer, the upper portion of the third spacer layer, and the first dielectric layer.

2. The semiconductor structure of claim 1, wherein a thickness of the upper portion of the third spacer layer is greater than a width of the first air gap, wherein the width of the first air gap is uniform.

3. The semiconductor structure of claim 1, wherein a distance from the substrate to a top of the second spacer layer is equal to a distance from the substrate to a top of the first air gap.

4. The semiconductor structure of claim 1, further comprising a second dielectric layer surrounding a top end of the bit line structure at a position between the first spacer layer and the upper portion of the third spacer layer to define a second air gap sealed within the first spacer layer, the upper portion of the third spacer layer, and the second dielectric layer.

5. The semiconductor structure of claim 4, wherein the second air gap has a tapered shape toward the first air gap.

6. The semiconductor structure of claim 4, wherein a length of the second air gap is less than a length of the first air gap.

7. The semiconductor structure of claim 4, wherein a width of the second air gap is less than a width of the first air gap.

8. The semiconductor structure of claim 1, further comprising:
   a contact, disposed on the substrate and adjacent to the bit line structure, wherein the contact is in direct contact with the lower portion of the third spacer layer.

9. The semiconductor structure of claim 8, wherein a distance between a top of the first air gap and the substrate is greater than a distance between a top of the contact and the substrate.

10. The semiconductor structure of claim 1, wherein the bit line structure comprises a nitride layer, a metal layer, and a mask layer stacked on substrate in sequence, wherein a distance from the substrate to a top of the air gap is greater than a distance from the substrate to a top of the metal layer.

* * * * *